United States Patent [19]

Yamaguchi et al.

[11] Patent Number: 5,763,059
[45] Date of Patent: Jun. 9, 1998

[54] CIRCUIT BOARD

[75] Inventors: Kouichi Yamaguchi; Noriaki Hamada; Hideto Yonekura; Takeshi Kubota; Yasuyoshi Kunimatsu; Yasuhide Tami; Masahiko Higashi; Yohji Furukubo, all of Kokubu, Japan

[73] Assignee: Kyocera Corporation, Kyoto, Japan

[21] Appl. No.: 623,979

[22] Filed: Mar. 29, 1996

[30] Foreign Application Priority Data

| Mar. 31, 1995 | [JP] | Japan | 7-076214 |
| Apr. 27, 1995 | [JP] | Japan | 7-103704 |
| Jun. 30, 1995 | [JP] | Japan | 7-165876 |
| Jul. 31, 1995 | [JP] | Japan | 7-195206 |
| Sep. 29, 1995 | [JP] | Japan | 7-253439 |
| Nov. 24, 1995 | [JP] | Japan | 7-305622 |
| Dec. 20, 1995 | [JP] | Japan | 7-332272 |

[51] Int. Cl.$^6$ ............................................. B32B 9/00
[52] U.S. Cl. ................. 428/209; 428/210; 428/901; 501/11; 501/62
[58] Field of Search .................... 428/209, 901, 428/210; 501/11, 62

[56] References Cited

U.S. PATENT DOCUMENTS

| 4,764,233 | 8/1988 | Ogihara | 501/11 |
| 4,816,323 | 3/1989 | Inoue | 428/901 |
| 5,304,518 | 4/1994 | Sunahara | 501/62 |

*Primary Examiner*—Patrick Ryan
*Attorney, Agent, or Firm*—Loeb & Loeb LLP

[57] ABSTRACT

In a circuit board obtained by providing a metallized layer of wiring on the surface or interior of an insulation substrate, the insulation substrate is, for example, a multi-layer circuit board or a package for semiconductor element, the insutating substrate obtained from a sintered body having a linear expansion coefficient of 8 to 18 ppm/° C. at 40° to 400° C. which is prepared by sintering a molded body containing 20 to 80% of a glass having a liner expansion coefficient of 6 to 18 ppm/° C. at 40° to 400° C. and 80 to 20% of a filler having a linear expansion coefficient of at least 6 ppm/° C. When the circuit board of the present invention is surface mounted on an outer electric circuit substrate such as a printed wiring board having a large linear expansion coefficient, the occurrence of stress due to a difference between the linear expansion coefficients of both is suppressed, and the circuit board and the outer electric circuit can be electrically connected accurately and firmly over a long period of time. Furthermore, a mounted structure of a circuit board having high reliability which can sufficiently dealt with the use of multiple pins due to large sizing of a semiconductor element can be realized. Furthermore, simultaneous sintering with the Cu metallized layer can be performed, and since the binder can be removed efficiently, the product is of high quality and is cheap.

13 Claims, 2 Drawing Sheets

FIG. I
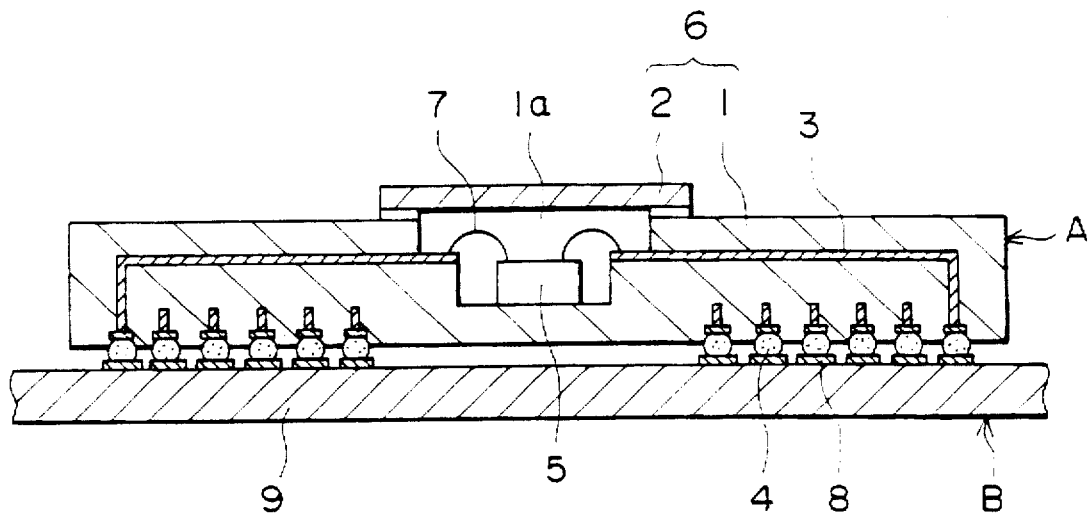
FIG.2
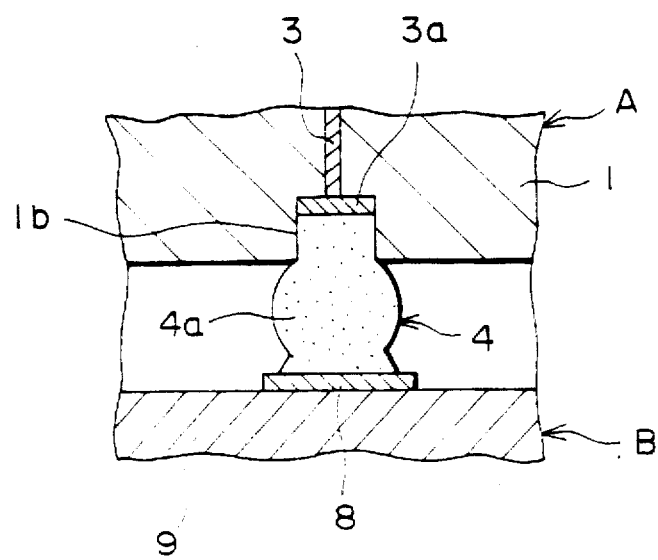

CIRCUIT BOARD

BACKGROUND OF THE INVENTION

1. Field of the Invention

This invention relates to a circuit board, and more specifically, to a circuit board having excellent reliability in which a metalized layer of wiring can be sintered simultaneously and a connected condition to an outer electrical circuit board such as a printed wiring board can be maintained stably and firmly for a long period of time.

2. Description of the Prior Art

Heretofore, circuit boards were of a structure in which a metalized layer of wiring is disposed on the surface or in the interior portion of an insulated substrate. A typical example of using this circuit board is a circuit board of a package for a semiconductor element or electrical element, especially LSI (large-scale integrated circuit element). Generally, it is constructed from an electrical insulating material such as alumina ceramics, an insulation substrate having a concave portion for accommodating a semiconductor element at the central portion of the upper portion of the above electrical insulated material, a plurality of metallized layers of wiring composed of a high melting metal powder such as tungsten or molybdenum led out from the surroundings of the concave portion of the insulation substrate toward the lower surface, a plurality of connecting pads formed on the lower surface or the side surface of the insulation substrate and to which the metallized layers of wiring are electrically connected, connecting terminals to be soldered and fixed to the connecting pads, and a closure body. Further, a semiconductor element is adhered and fixed to the bottom surface of the concave portion via an adhesive composed of glass or resin, each electrode of the semiconductor element and the metallized layers of wiring are electrically connected via a bonding wire, the closure body is conjugated with the upper surface of the insulation substrate via a sealing material such as glass or resin, and the semiconductor element is hermetically sealed to the inside of a container composed of the insulation substrate and the closure body.

Such a package for a semiconductor element is surface mounted by electrically connecting the connecting terminals connected to a wiring conductor of the outer electrical circuit substrate by means of a solder.

As the degree of integration of a semiconductor element becomes higher, the number of electrodes formed in the semiconductor element increases but the number of terminals in the package for semiconductor element which accommodates the semiconductor element increases. When the number of electrodes increases, it is necessary to increase the size of the package itself. Simultaneously with this, small-sizing is also required, and therefore, it is necessary to increase the density of the connecting terminals in the package.

The structure of the terminal in the package is a pin grid array (PGA) most generally used in which a metal pin such as Kovar is connected to the the lower surface of the package. Recent examples include a quad flat package (QFP) in which a L-form metallic member is soldered on a metallized layer of wiring led out onto four side surfaces of the package, a ball grid array (BGA) constructed by ball-like terminals composed of a solder on the lower surface of an insulation substrate as shown in FIG. 1, and a leadless chip carrier (LCC) without a lead pin which is provided with electrode pads in four side surfaces of the package as shown in FIG. 4. It is said that among these methods, BGA is most able to perform highest density packaging.

According to BGA, a ball-like terminal composed of a soldering material such as a solder is soldered to a connecting pad, placing the ball-like terminal on a wiring conductor of the outside electric circuit board, thereafter heating and melting the ball-like terminal at a temperature of about 250° to 400° C., and conjugating the ball-like terminal with the wiring conductor of the outside electric circuit, in result BGA is surface-mounted on the outer electric circuit substrate. By this mounted structure, the semiconductor element accommodated in the interior of the semiconductor element-accommodating package of which each electrode is electrically connected to the outer electrical circuit via the metallized wiring layer and the ball-like terminal.

The insulated substrate in the package for semiconductor element can be used a sintered body of alumina or mulite. Recently, a cheap Cu or Ag could be used as a wiring layer which can be sintered at low temperatures. For this purpose, a glass-ceramics is used. Sintered bodies of glass-ceramics were proposed in Japanese Laid-Open Patent Publication No. 119814/1975, Japanese Laid-Open Patent Publication No. 176651/1983, Japanese Patent Publication No. 59029/1991, Japanese Patent Publication No. 37759/1991 and Japanese Laid-Open Patent Publication No. 117929/1988.

For example, Japanese Laid-Open Patent Publication No. 117929/1988 proposed a glass-ceramic body using $ZnO$—$Al_2O_3$—$SiO_2$ type glass. This Japanese Laid-Open Patent Publication reports that by controlling the chemical composition and heat-treating conditions, crystals of zinc silicate, cordierite and zinc small pebbles are formed and its coefficient of thermal expansion can be controlled.

Ceramics such as alumina and mulite generally used conventionally as an insulated substrate of these packages have a high strength of at least 200 MPa and possess a coefficient of thermal expansion of about 4 to 7 ppm/° C. On the other hand, printed wiring boards obtained by forming a conductor circuit on the surface of an insulation layer containing organic resins such as glass-epoxy, which are most frequently used as an outer electric circuit substrate, have a coefficient of thermal expansion of as great as 12 to 18 ppm/° C. Furthermore, the conventional glass-ceramic bodies have a coefficient of thermal expansion of about 4 to 8 ppm/° C.

For this reason, when conventional package for semiconductor element are mounted on an outer electrical circuit substrate such as the printed wiring board, if the heat generated at the time of operation or the change in environmental temperature is repeatedly impressed on the insulation substrate and the outer electrical circuit board, a great thermal stress is generated due to a difference in the coefficient of thermal expansion between the insulation substrate and the outer electrical circuit board. This thermal stress gives a small influence when the number of terminals in the BGA package is relatively small of 300 or less and the package itself is small-sized. But this influenece tends to increase when the number of terminals increases, the package becomes large in size and its area becomes 10 mm×10 mm or above.

For example, when thermal stress is repeatedly impressed by the repetition of the operation and stopping of the semiconductor device, this thermal stress acts on the connecting terminal on the lower surface of the insulation substrate of the package or acts on the conjugation interface between the connecting terminal and the wiring conductor of the outside electrical circuit board. As a result, the connecting terminal is peeled off from the insulation substrate, the connecting terminal is peeled off from the wiring conductor of the outside electrical circuit board, and there is a defect that the connecting terminal of the package for semiconductor element cannot be electrically stably connected for a long period of time to the wiring conductor of the outer electrode circuit.

It may thus be considered that the insulation substrate or a substrate in a package for semiconductor element is prepared from a material having a high coefficient of thermal expansion. For example, Japanese Laid-Open Patent Publication No. 117929/1988 reports that an integrated circuit package substrate utilizing a glass-ceramic body can give a substrate having a all coefficient of thermal expansion. However, as described in the Patent Publication, since the starting material does not contain glass and the characteristics are controlled by the crystalline phase which is precipitated from the crystalline glass, even if the substrate has the same composition but by the difference of heat treating conditions, a precipitated crystal phase varies and it is difficult to control the coefficient of thermal expansion. Furthermore, since only an expensive crystalline glass is used, it is impossible to produce a package cheaply.

Furthermore, to thermally expand the glass-ceramic sintered body highly, it is desired to precipitate a filler component having a high thermal expansion. Among these fillers, cristobalite, quartz and forsterite have a high coefficient of thermal expansion of at least 10 ppm/° C. so that they are favorable fillers for thermally expand to a high degree. However, these crystalline phases have a inflection point at which a coefficient of thermal expansion abruptly varies in their thermal expansion characteristics, for example about 230° C. for cristobalite and about 570° C. for quartz. When these crystalline phases are used approximately at these temperatures, the circuit board and the printed wiring board or the metallized layer of wiring give rise to poor connection by the variation of thermal expansion characteristics. Furthermore, forsterite alone tends to give a high dielectric constant.

On the other hand, ceramics used as an insulation substrate for multi-layer circuit boards or packages for accommodating a semiconductor element are desired to be colored in order to apply a contrast in optically searching and detecting a bonding position at the time of wire bonding or to prevent the development a poor outside appearance by color unevenness of products having no characteristic problem and to increase the yield of the products. Heretofore, coloration has been performed by adding metal elements such as W or Mo to such an alumina sintered body, and mainly W and Mo are added to glass-ceramics.

However, the dielectric loss of a circuit board should be decreased. But generally glass-ceramic sintered bodies obtained by sintering molded bodys composed of a glass component and a filler component have a larger dielectric loss than alumina sintered bodies. Specifically, the alumina sintered bodies have a dielectric loss of about $5 \times 10^{-4}$ at a measuring frequency of 1 MHz, whereas the glass-ceramic sintered bodies have a dielectric loss of as large as about $25 \times 10^{-4}$.

In addition, W or Mo used heretofore as a coloring agent is added to color the glass-ceramic sintered bodies. As the amount of addition becomes large, the dielectric loss tends to become large. Thus, it cannot be added in a large amount.

SUMMARY OF THE INVENTION

It is an object of the present invention to provide a circuit board having high reliability which substrate in a package for semiconductor element can maintain a connected condition stably and firmly for a long period of time to a printed circuit board.

It is another object of the present invention to provide a cheap circuit board at a low dielectric constant which can fire a Cu or Ag metallized layer of wiring simultaneously and can carry out sintering at a low temperature with an effective removal of a binder and a relatively small amount of glass.

It is a further object of the present invention to provide a circuit board composed of a colored glass-ceramic sintered body as a insulation substrate which can fully be colored, can be simultaneously sintered with a wiring layer such as Cu or Ag, and has a smaller dielectric loss than heretofore.

According to this invention, there is provided a circuit board comprising an insulating substrate and a metallized layer of wiring, wherein the insulating substrate is a sintered body having a linear expansion coefficient of from 8 to 18 ppm/° C. at a temperature of from 40° to 400° C. obtainable by sintering a mold body comprising 20 to 80% by volume of a glass having a linear expansion coefficient of from 6 to 18 ppm/° C. at a temperature of from 40° to 400° C. and 80 to 20% by volume of a filler having a linear expansion coefficient of 6 ppm/° C. or more at a temperature of 40° to 400° C.

According to the present invention, by using a glass-ceramic sintered body obtained by molding and sintering a mixture of glass having a linear expansion coefficient of 6 to 18 ppm/° C. at a temperature of 40° to 400° C. and a filler having a linear expansion coefficient of 6 ppm/° C. or more at a temperature of 40° to 400° C. as an insulation substrate of a circuit board such as package for semiconductor element, the linear expansion coefficient of the sintered body after sintering can be easily controlled to a range of 8 to 18 ppm/° C., and the sintered body can be produced with good reproducibility.

According to the present invention, by using a ceramic having a linear expansion coefficient of 8 to 18 ppm/° C. at a temperature of 40° to 400° C. as a an insulation substrate in a circuit board to be mounted on a printed circuit board in which a conductor circuit is formed on the surface of the insulation layer containing at least an organic resin, such as a glass-epoxy substrate, the difference in linear expansion coefficient between the insulation substrate and an outer electrical circuit board becomes small, and as a result, when the substrate becomes large-sized, a thermal stress due to a difference in linear expansion coefficient between the insulation substrate and the printed circuit board does not cause the terminal to have poor connection to a wiring conductor of the printed circuit board, and the semiconductor element accommodated in the inside of the package can be electrically connected to the printed circuit board correctly and firmly for a long period of time.

When the circuit board has an area of 10 mm×10 mm or more, the connection of the circuit board to the printed circuit board is not by means of a conventional pin but carried out by means of a ball terminal formed on the lower surface of the substrate, or an electrode pad formed on the side surface of the substrate. A thermal stress due to the difference in thermal expansion coefficient from the printed circuit board may increase. In such a case, by using a glass ceramic having a linear expansion coefficient of 8 to 18 ppm/° C. as the insulation substrate in the circuit board, a circuit substrate having reliability can be obtained without developing the aforesaid poor connection. By using the glass having a deforming temperature of 400° to 800 ° C., a molding binder such as an organic resin added at the time of molding can be efficiently removed, and sintering conditions for the metallized layer to be simultaneously sintered as the insulation substrate can be matched.

Preferably, when a lithium silicate glass containing 5 to 30% by weight of $Li_2O$ is used as the above-mentioned glass, highly thermally expansible lithium silicate (such as $Li_2SiO_3$) can be precipitated in the sintered body after sintering. It is advantageous that glass having a deforming temperature of 400° to 800° C. can decrease the amount of glass contained, and increase the amount of the filler. Furthermore, it is possible to elevate the sintering shrinkage initiating temperature. Accordingly, a molding binder such as organic resins added at the time of molding can be efficiently removed, and at the same time, it is possible to match sintering conditions for the metallized conductor to be simultaneously sintered with the insulation substrate.

The lithium silicate crystal phase precipitated from the glass such as lithium silicate glass by sintering has a linear expansion coefficient of about 13 ppm/° C. By compounding a specific amount of a filler having a linear expansion coefficient of at least 6 ppm/° C. at 40° to 400° C., it is possible to easily control the linear expansion coefficient of the entire sintered body within a range of 8 to 18 ppm/° C.

Furthermore, since the sintered body has a near linear expansion coefficient of Cu used as an internal wiring of a circuit board which has a linear expansion coefficient of 18 ppm/° C., it is possible to increase the reliability of intimate adhesion to the substrate of a metallized wire.

The aforesaid sintered body forming the insulation substrate can be obtained by mixing glass and the filler at a specific ratio, molding the mixture, and sintering it. The microstructure of the sintered body after sintering consists of a specific crystalline phase and a glass phase, and especially, it may preferably contain an enstatite phase as a crystalline phase. Preferably, the sintered body is composed of a forsterite phase and an enstatite phase, and the proportion of the crystalline phase is at least 50% by weight from the viewpoint of the linear expansion coefficient, sinterability, strength and other characteristics.

BRIEF DESCRIPTION OF THE DRAWINGS

FIG. 1 is a sectional view for explaining the mounted structure of a ball grid array-type (BGA type) package for semiconductor element in accordance with the present invention;

FIG. 2 is an enlarged sectional view of essential parts of a connecting terminal in FIG. 1;

DETAILED DESCRIPTION OF THE PREFERRED EMBODIMENTS

Figure 3:
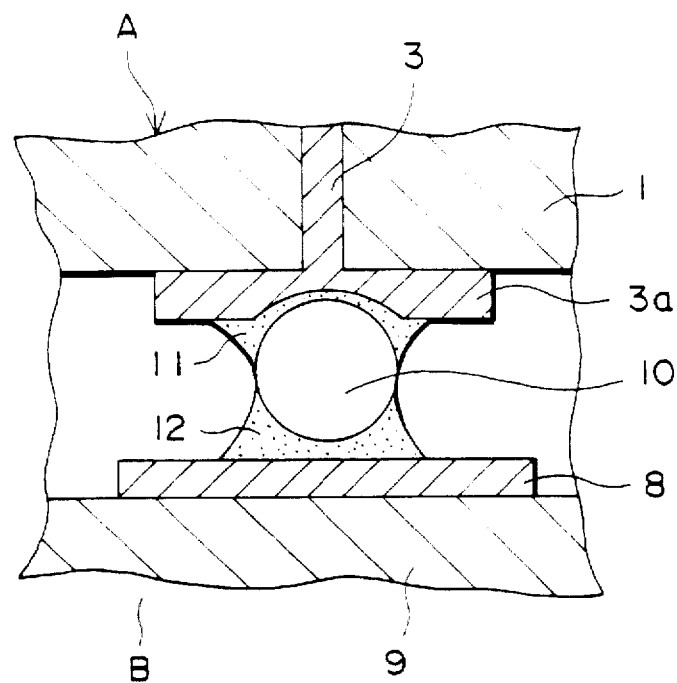
FIG. 3 is an enlarged sectional view of essential parts showing an embodiment of a connecting terminal in another example.

In the following, one example of the present invention will be described in detail with reference to the accompanying drawings.

FIGS. 1 and 2 show one example of a ball grid array (BGA) type package for semiconductor element and its mounted structure. A shows BGA type package, and B represents an outer electric circuit substrate.

The package for semiconductor element is constructed of an insulation substrate 1, a closure 2, a metallized layer of wiring 3 and a connecting terminal 4 and a semiconductor element 5 which is contained in the interior of a package. The insulation substrate 1 and the closure body 2 form a container 6 for containing the semiconductor element 5 hermetically. A concave portion 1a for placing and accommodating the semiconductor element 5 is provided in the central portion of the upper surface of the insulation substrate 1, and the semiconductor element 5 is adhered and fixed to the bottom surface of the concave portion 1a via an adhesive such as glass or a resin.

Furthermore, in the insulation substrate 1, a plurality of metallized layers of wiring 3 are adhered and formed from the circumference of the concave portion 1a in which the semiconductor element 5 is accommodated to its lower. Furthermore, as shown in FIG. 2, a number of concave portions 1b are provided in the lower surface of the insulation substrate 1. In the bottom surface of the concave portions 1b, a connecting pad 3a electrically connected to the metallized layers of wiring 3 is adhered and formed. On the surface of the connecting pad 3a, a projected terminal 4 composed of a solder material such as EL solder (tin-lead alloy) is formed as a connecting terminal to a wiring conductor 8 formed on the surface of the outer electrical circuit substrate B. This projected terminal 4 is formed by arranging a spherical or pillar-like solder material with the connecting pad 3a, or printing the solder material on the connecting pad by the screen printing method.

The connecting terminal 4 secured to the connecting pad 3a has a projecting portion 4a on the lower surface of the insulation substrate land acts to connect the connecting pad 3a, to which each electrode of the semiconductor element 5 is connected, to a wiring conductor 8 of the outer electrical circuit substrate B and acts to mount the package A on the outer electrical circuit substrate B.

The metallized layers 3 of wiring electrically connected to the connecting pad 3a are electrically connected to each electrode of the semiconductor element 5 via a bonding wire 7 whereby the electrodes of the semiconductor element are electrically connected to the connecting pad 3a.

On the other hand, the outer electrical circuit substrate B is constructed of the insulator 9 and the wiring conductor 8, and the insulator 9 is composed of a material at least containing an organic resin, such as a printed circuit board. Specifically, it is composed of an insulation material having a linear expansion coefficient of 12 to 16 ppm/° C. at 40° to 400° C. such as a glass-epoxy type composite material. Furthermore, the wiring conductor 8 to be formed on the surface of the circuit board B is usually composed of a metal conductor such as Cu, Au, Al, Ni, and Pb—Sn in respect of the adjustability of linear thermal expansion coefficient to the insulator, and good electric conductivity.

To mount the package for semiconductor element A on the printed circuit board B, the projecting terminal 4 composed of a solder secured to the connecting pad 3a on the lower surface of the insulation substrate 1 of the package A is placed and caused to abut with the wiring conductor 8 of the printed circuit board B, thereafter the projecting terminal 4 is heated at a temperature of about 200° to 400° C. to melt the projecting terminal 4 itself composed of a solder material such as a solder, and the terminal 4 is conjugated with the wiring conductor 8 thereby to mount the package A on the surface of the outer electrical circuit board B. At this time, a solder material may desirably be adhered to the surface of the wiring conductor 8 in order to carry out connection between the terminal 4 and the solder material easily.

As another example shown in FIG. 3, a ball-like terminal 10 composed of a high melting material soldered with a low melting solder material may be applied as the connecting terminal 4. This high melting material should have a higher melting point than the low melting solder material used for soldering. When the soldering solder material is a solder having a low melting point composed of 40% by weight of Pb and 60% by weight of Sn, the ball-like terminal is, for example, a high melting solder composed of 90% by weight of Pb and 10% by weight of Sn, or is composed of a metal such as Cu, Ag, Ni, Al, Au, Pt or Fe. In such a construction, the ball-like terminal 10 secured to the connecting pad 3a on the lower surface of the insulation substrate 1 of the package A is placed and caused to abut with the wiring conductor 8 of the printed circuit board B, and thereafter, the ball-like terminal 10 can be adhered to the wiring conductor 8 by means of a solder material 12 such as a solder and can be mounted on the circuit board B. Furthermore, by using an Au—Sn alloy as a low melting solder material, the connecting terminal may be connected to the printed circuit board. A pillar-like terminal may be used instead of the ball-like terminal.

Figure 4:
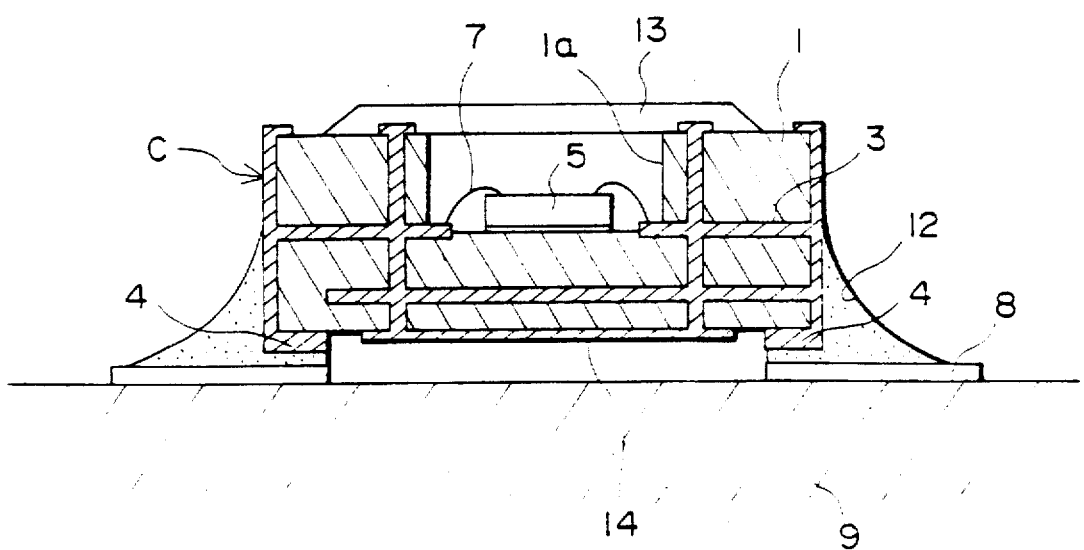
FIG. 4 is a sectional view for explaining a mounted structure of a leadless chip carrier-type package of the present invention.

Now, with reference to FIG. 4, a mounted leadless chip carrier (LCC) type package for semiconductor element C on the outer electrical circuit substrate (printed circuit board) B will be explained. In FIG. 4, the same members as in FIG. 1 will be represented by putting the same reference numerals. In the package C in FIG. 4, the metallized layer 3 of wiring is led out on the side surface of the insulation substrate 1, and the metallized layer led out onto the side surface constitutes the connecting terminal 4. Furthermore, in the package C, for example to prevent an electric magnetic wave obstruction, an epoxy resin is filled in the concave portion 1a for accommodating the semiconductor element 5, and a closure 13 composed of an electroconductive resin is used to seal the concave portion. Furthermore, a conductive layer 14 is formed for earthing on the bottom surface of the package C.

In order to mount this package C on the outer electrical circuit substrate B, the connecting terminal 4 of the side surface of the insulator substrate 1 is placed and caused to abut with the wiring conductor 8 of the outer electrical circuit substrate B and is electrically connected by means of a solder material. At this time, it is desired that a solder material should be adhered and formed on the surface of the connecting terminal 4 or the wiring conductor 8 in order to easily perform connection by means of a solder material.

According to the present invention, as a package for semiconductor to be mounted on the surface of the printed circuit board B, it is important that the sintered body constituting the insulation substrate 1 should have a linear expansion coefficient of 8 to 18 ppm/° C., especially 9 to 14 ppm/° C., at a temperature of 40° to 400° C. This is important because the generation of a thermal stress is relaxed by the difference of thermal expansion from the printed circuit board B, and the electrical connected condition between the printed circuit board B and the package A can be maintained in a good condition for a long period of time. If the linear expansion coefficient is smaller than 8 ppm/° C. or is larger than 18 ppm/° C., a thermal stress due to a thermal expansion difference becomes large, and it is impossible to prevent worsening of an electrical connected condition between the printed circuit board B and the package A.

As the linear expansion coefficient of the insulation substrate becomes as large as 8 to 18 ppm/° C., the thermal expansion difference between the substrate and the semiconductor element becomes conversely large. Therefore, to adhere the insulation substrate 1 to the semiconductor element 5, it is necessary to properly select the glass and the organic adhesive. In order to buff a stress due to a difference of thermal expansion coefficient, it is desirable to construct the adhesive from a frangible material such as an organic adhesive material such as an epoxy type or polyimide type material, or a mixture of such an adhesive material and a metal such as Ag.

According to the present invention, the sintered body may be constructed by sintering a molded mixture composed of 20 to 80% by volume of a glass and 80 to 20% by volume of a filler component. The reason why the amount of the filler component is limited to the about in the aforesaid range is that if the amount of the glass is less than 20% by volume, it is impossible to sinter the liquid phase and it must be sintered at a high temperature. In that case, the metallized layer composed of Cu, Au, Ag will be molten in the simultaneous sintering of the metallized layer. If the amount of the glass is larger than 80% by volume, the properties of the sintered body depend greatly upon the properties of the glass, the properties of the material become difficult to control and the sintering initiating temperature becomes low so that a problem of the remaining of a binder remains. Furthermore, the cost of the starting material becomes high.

Preferably, the glass should not contain Pb. Since Pb has toxicity, a particular device and a control for preventing poisoning in a production step are required so that the sintered body cannot be produced at a low cost. When Pb inevitably gets mixed as an impurity, the amount of Pb should be desirably 0.05% by weight or less.

Furthermore, it is prefered that the glass should have a deforming temperature of 400° to 800° C., especially 400° to 650° C. When a mixture composed of the glass and the filler is molded, a molding binder such as an organic resin is added. At this time, it is necessary to remove the binder efficiently and to match sintering conditions for the metallized layer to be simultaneously sintered together with the insulation substrate. If the deforming temperature is lower than 400° C., the glass is sintered from a low temperature. For example, the metallized layer cannot be sintering simultaneously with a sintering initiation temperature of 600° to 800° C. for Ag and Cu. Furthermore, the sintering of the molded body is initiated at a low temperature, the binder cannot be decomposed and volatilized, and the binder component remains and adversely affects the properties. On the other hand, if the deforming temperature is higher than 800° C., it becomes difficult to sinter the molded body unless the amount of the glass is increased. Since the expensive glass is required in a large amount, the cost of the sintered body is increased.

Depending upon the deforming temperature, the amount of the glass is desirably adjusted properly. When the deforming temperature of the crystaal glass is as low as 400° to 650° C., the amount of the filler can be compounded in a relatively large proportion of 50 to 80% by volume since the sinterability at a low temperature increases. On the other hand, when the deforming temperature of the glass is as high as 650° to 800° C., the amount of the filler is desirably compounded in a relatively small proportion of 20 to 50% by volume since the sinterability is lowered.

When the glass used in the present invention is used alone without adding a filler, the shrinking initiation temperature is 700° C. or less, Cu metallized layer of wiring cannot be provided.

However, by mixing the filler in a proportion of 20 to 80% by volume, it is possible at the sintering temperature to precipitate the crystal and form a liquid phase for sintering the filler component. Furthermore, since the the shrinking initiation temperature of the molded body can be increased, the simultaneous sintering conditions for the metallized layer of wiring can be matched depending upon the material of the metallized layer of wiring and the content of the filler. Furthermore, to lower the cost of the starting material, it is preferred to decrease the content of the glass which is expensive.

For prefered example, when the metallized layer of wiring is constructed from at least one metal selected from Cu, Ag, Ni, Pd and Au, this metallized layer can be sintered at 600° to 1000° C. To perform simultaneous sintering, the deforming temperature of the glass is 400° to 650° C., and the content of the filler is preferably 50 to 80% by volume. Furthermore, by decreasing the amount of the expensive glass, the cost of the sintered body can be decreased.

It is also necessary that the glass should have a linear expansion coefficient should be 6 to 18 ppm/° C., especially 7 to 13 ppm/° C., at a temperature of 40 to 400° C. If the linear expansion coefficient falls outside the above range, a thermal expansion difference between the glass and the filler is developed, and this may become a cause of decrease in the strength of the sintered body. Furthermore, when the linear expansion coefficient of the filler is less than 6 ppm/° C., it becomes difficult to adjust the the linear expansion coefficient of the sintered body to 8 to 18 ppm/° C.

Examples of the glass which satisfies the above properties include $SiO_2$—MgO, $SiO_2$—$Al_2O_3$—$Na_2O$, $SiO_2$—MgO—CaO, $SiO_2$—$Al_2O_3$—$Li_2O$, $SiO_2$—MgO—$Li_2O$, $SiO_2$—ZnO—$Li_2O$, $SiO_2$—MgO—BaO, $SiO_2$—BaO—$Al_2O_3$—$B_2O_3$, $SiO_2$—$Na_2O$—$P_2O_5$—CaO, $SiO_2$—$Na_2O$—$Al_2O_3$—$P_2O_5$—ZnO, $SiO_2$—BaO—$Al_2O_3$, —MgO—$TiO_2$—$ZrO_2$, $SiO_2$—$Al_2O_3$—BaO—$Na_2O$, $Sio_2$—$Li_2O$—$Al_2O_3$—$K_2O$—$P_2O_5$—ZnO, $SiO_2$—$Al_2O_3$—CaO—$B_2O_3$—$Na_2O$, $SiO_2$—$Li_2O$—$Al_2O_3$—MgO—$Tio_2$, $SiO_2$—$Li_2O$—$Al_2O_3$—MgO—$Na_2O$—F, $SiO_2$ —$Li_2O$—$Al_2O_3$—$K_2O$—$Na_2O$—ZnO, $SiO_2$—$Li_2O$—$Al_2O_3$—$K_2O$—$P_2O_5$ and $SiO_2$—$Li_2O$—$Al_2O_3$—$K_2O$—$P_2O_5$—$Na_2O$.

Among these glass compositions, it is preferred to use a lithium silicate glass containing 5 to 30% by weight, especially 5 to 20% by weigt, of $Li_2O$. The use of such a lithium silicate glass can lead to the precipitation of lithium silicate having a high thermal expansion coefficient at the time of sintering.

If the content of $Li_2O$ is lower than 5% by weight, the amount of lithium silicate crystal formed at the time of sintering is low, and the improved effect of the linear expansion coefficient becomes small. If the content of $Li_2O$ exceeds 30% by weight, the dielectric loss exceeds 100× $10_{-4}$, and the substrate has deteriorated characteristics.

When the above lithium silicate glass contains $B_2O_3$, its content is preferably 1% by weight or below of $B_2O_3$.

On the other hand, the filler used in the present invention should have a linear expansion coefficient of at least 6 ppm/° C. at least at a temperature of 40° to 400° C. Examples of such a filler include fillers having a crystalline phase having a thermal expansion coefficient of at least 6 ppm/° C., such as at least one member selected from the group consisting of cristobalite ($Sio_2$), quartz ($SiO_2$), tridymite ($SiO_2$), foresterite ($2MgO.SiO_2$), spinel (MgO. $Al_2O_3$), wollastonite ($CaO.SiO_2$), monticellite ($CaO.MgO.SiO_2$), nepheline ($Na_2O.Al_2O_3.SiO_2$), lithium silicate ($Li_2O.SiO_2$), diopside ($CaO.MgO.2SiO_2$), merbinite ($3CaO.MgO.2SiO_2$), akelmite ($2CaO.MgO.2SiO_2$), magnesia (MgO), alumina ($Al_2O_3$), carnegieite ($Na_2O.Al_2O_3.2SiO_2$), enstatite ($MgO.SiO_2$), magnesium borate ($2MgO.B_2O_3$), celsian ($BaO.Al_2O_3.2SiO_2$), $B_2O_3.2MgO$. $2SiO_2$, gahnite ($ZaO.Al_2O_3$) and petalite ($LiAlSi_4O_{10}$). Among these fillers, those having a crystalline phase having a linear expansion coefficient of at least 8 ppm/° C. are preferred. Of these, forsterite is especially preferred.

Furthermore, according to this invention, in order to color the composition of the molded body before sintering, a Cr compound is added as a coloring agent in a proportion of 0.05 to 10 parts by weight calculated as $Cr_2O_3$ per 100 parts by weight of a main component composition composed of the glass component and the filler component. Cr is an important component to color the composition and decrease the dielectric loss. If its proportion is less than 0.05 part by weight calculated as $Cr_2O_3$, the coloration of the composition is insufficient and it is impossible to decrease the dielectric losss of the composition. If its amount exceeds 10 parts by weight, the sinterability of the composition is obstructed and the density and strength are adversely affected. The inclusion of Cr can give a sintered body which assumes a greenish color. The amount of Cr is desirably 0.2 to 6 parts by weight calculated as $Cr_2O_3$. The form in which it is added is most desirably $Cr_2O_3$. However, a carbonate salt, a nitrate salt, an acetate salt, and Cr-containing organic compounds which form $Cr_2O_3$ in the process of sintering may also be used. Furthermore, a carbide and a nitride of Cr have a coloring effect and an effect of decreasing the dielectric loss.

According to this invention, in the composition of the molded body, Cr may be added in an amount of at least 0.05 part by weight calculated as $Cr_2O_3$ per 100 parts by weight of the main component composition comprising the glass component and the filler component and at least one member selected from Cu, V, Fe, Ni, Mn and Co may be added in an amount of not larger than 10 parts by weight as a total of the amount calculated as an oxide and the amount of Cr compound calculated as $Cr_2O_3$ mentioned above. By adding aforsaid metals, the color of the sintered body can be variously changed from a greenish color to a reddish color, a bluish color, a yellowish color, or a blackish color without obstructing the effect of adding a Cr compound. If the total amount of these coloring agents exceeds 10 parts by weight, the sinterabillity will be hampered and there will be an adverse effect on density or strength. Desirably, Cr is added in an amount of at least 0.2 part by weight calculated as $Cr_2O_3$ and the amount of at least one compound selected from Cu, V, Fe, Ni, Mn and Co as a total of the amount calculated as an oxide and the amount of $Cr_2O_3$ calculated for the above Cr compound is not larger than 6 parts by weight.

The mixture of the glass and the filler or further the coloring agent and a suitable molding organic resin binder are added, the resulting mixture is molded by, for example, a doctor blade or a die press or by a rolling method into a sheet shape, and thereafter, the sheet is sintering.

In sintering the sheet, the binder compounded for molding is first removed. The binder is removed by placing the sheet in a nitrogen atmosphere having steam at a temperature of 100° to 700° C. At this time, the shriking initiation temperature should be desirably about 700 to 850° C. If the shriking initiation temperature is lower than the above-mentioned temperature, it is difficult to remove the binder, and it becomes necessary to control the characteristics of glass in the molded body, especially the deforming temperature.

The sintering is carried out in an oxidizable atmosphere at a temperature of 850° to 1300° C. This sintering makes the molded body dense sintered body to a relatively density of at least 90%. When the sintering temperature is lower than 850° C., it is impossible to make the molded body density. If the sintering temperature exceeds 1300° C., the metallized layer, such as Cu, Au, and Ag will be melted by simultaneous sintering with the metallized layer of wiring.

The glass ceramic sintered body produced as mentioned above contains a crystal phase from glass, the filler component, and a crystal phase formed by reaction between glass and the filler, and a glass phase exists in grain boundaries of these crystal phases. It is desirable that a crystal phase having a linear expansion coefficient of at least 6 ppm/° C. at 40° to 400° C. should be precipitated in order to elevate the linear expansion coefficient of the entire sintered body.

The sintered bodies of the present invention preferably include a sintered body obtained by sintering a molded body composed of 20 to 80% by volume of lithium silicate glass containing 5 to 30% by weight of $Li_2O$ and 80 to 20% by volume of a filler containing a metal oxide having a linear expansion coefficient of at least 6 ppm/° C. at 40° to 400° C., and a sintered body obtained by sintering a molded body composed of the lithium silicate glass and the filler containing the said ratio of forsterite. Furthermore, a filler containing forsterite and quartz or a filler containing forsterite and quartz and at least one selected from petalite, nepheline, lithium silicate and lithia are preferred.

When the filler containing forsterite and quartz is combined with the lithium silicate glass and the mixture is sintered, quartz and enstatite, or quartz, enstatite and forsterite are precipitated, and furthermore, lithium silicate crystal phase is precipitated from the glass. The cristobalite phase is not precipitated. Since the cristobalite phase has a flexing point in the vicinity of 230° C. at which the linear thermal expansion coefficient abruptly changes, if it is used in the vicinity of 230° C., there is a possibility that poor connection between the circuit board and the printed circuit board or the metallized layer of wiring will occur.

A filler containing forsterite and quartz and further at least one member selected from petalite, nepheline, lithium silicate and lithia has an effect of promoting crystallization of lithium silicate, and the molded body can be advantageously sintered at a temperature lower than 1000° C.

The lithium silicate crystal phase precipitated from the lithium silicate glass has a linear expansion coefficient of about 13 ppm/° C. Addition of at least foresterite and quartz to such glass can give quarts phase stably. Furthermore, if a metal oxide having a linear expansion coefficient of at least 6 ppm/° C. at 40° to 400° C. is added as the filler, it is easy to control the thermal expansion coefficient of the entire sintered body to a range of 8 to 18 ppm/° C.

Furthermore, the coloring agent exists in the grain boundary of the phase as a compound at the time of addition or an amorphous. Furthermore, in the sintered body of the present invention, the microstructure of the sintered body after sintering is preferably composed of 50 to 99% by weight of a crystal phase and 1 to 50% of a glass phase in which the amount of its crystal phase is 20 to 85% by weight as a total amount and in which the crystal phase consists of enstatite, or both enstatite and forsterite and an embedment containing the above crystal phase and the lithium silicate crystal phase. Since in the sintered body of each of the above embodiments, the foresterite has a high linear expansion coefficient of 10 ppm/° C., the enstatite has a high linear expansion coefficient of 9 ppm/° C., and the lithium silicate has a high linear expansion coefficient of 12 ppm/° C., it is possible to control the thermal expansion coefficient of the sintered body very easily to a range of 8 to 18 ppm/° C.

Furthermore, in the glass ceramic sintered body, enstatite is formed as a crystal phase, whereby the bonding between the glass and foresterite can be increased and the sinterability can be elevated. A part of enstatite is formed by a reaction between glass and foresterite, and bonding between the crystal phase and the glass phase can be reinforced.

Since the glass ceramic sintered body of this embodiment can be sintered at a low temperature of 800° to 1000° C., the layer of wiring in the circuit board or a package for semiconductor element can be formed by a cheap conductor such as Cu or Ag and the cost of the product can be decreased.

When the amount of forsterite or enstatite is smaller than 20% by weight, it is slightly difficult to control the thermal expansion coefficient to a range of 8 to 18 ppm/° C. Furthermore, since the containing amount of glass increases, the cost of the product becomes high. Conversely, if the above amount is larger than 85% by weight, sintering is not performed so well, and it is impossible to obtain an dense sintered body. The preferred amount of forsterite and enstatite is 60 to 75% by weight as a total. When the crystal phase include quartz, the preferred amount of forsterote, enstatite and quarts is 60 to 70% by weight as total. More preferably, the crystal phase contains lithium silicate.

Since lithium silicate has a linear expansion coefficient of 12 ppm/° C., it contributes to the stabilization of high thermal expansion and also has an effect of increasing strength. This lithium silicate is desirably precipitated from glass in the sintering step. To precipitate lithium silicate crystal, it is necessary that the glass should contain 5 to 30% by weight of $Li_2O$.

The crystal phase can contain another crystal component to control the linear thermal expansion coefficient. Examples of the other crystal component include metal oxides having a linear expansion coefficient of at least 6 ppm/° C. at a temperature of 40° to 400° C., for example, cristobalite, quartz, spinel, magnesia, alumina and petalite.

A specific method of producing the above glass ceramic sintered body will be explained. There are a method of using a forsterite powder, an enstatite powder and a glass powder and a method of using a forsterite powder and a glass powder as a starting material.

Twenty to eighty-five % of a forsterite powder or both the forsterite powder and the enstatite powder and as the remainder, the glass are mixed. This mixture is molded by a desired molding means such as a doctor blading method, a die pressing method, an extrusion molding method, and a rolling method into a desired shape, such as a sheet and thereafter the molded body is sintered at a temperature of 800° to 1000° C. in an oxidizable atmosphere or in a non-oxidizable atmosphere.

Since enstatite $(MgO.SiO_2)$ contains a larger amount of $SiO_2$ than forsterite $(2MgO.SiO_2)$, a part of forsterite reacts with $SiO_2$ as a solid solution in a step of sintering whereby a reaction for converting the above reactants to enstatite. For this reason, by using glass containing at least 50% by weight of $SiO_2$, 20 to 85% by weight of forsterite is mixed with the glass as a remainder, the mixture is molded by the above-mentioned method, and the molded body is sintered at a temperature of 800° to 1000° C. in an oxidizable atmosphere to yield enstatite.

To produce a circuit board by using the glass ceramic sintered body of the present invention, a suitable organic binder, plasticizer and solvent are added to the above glass ceramics starting materials for constituting the insulation substrate to form a slurry, and the slurry is converted to a green sheet by employing a doctor blading method or a calender rolling method. To form a metallized layer of wiring and a connecting pad, an organic binder, a plasticizer and a solvent are admixed with at least one type of metal powder selected from Cu, Ag, Ni, Pd and Au to form a metal paste, and the metal paste is printed and coated on the green sheet by a well known screen printing method in a predermined pattern. As occasion demands, through-holes are formed by a suitable punching method on the above-mentioned green sheet, and the metallizing paste is filled in the through-holes. A plurality of the green sheets are laminated, and the green sheets and the metallized layers are simultaneously sintered at a temperature of 800° to 1000° C. to obtain a circuit board such as a package for semiconductor element having a multilayer structure.

EXAMPLES

The present invention will be illustrated specially by the specific examples given below.

Example 1

As a glass, a glass having a weight proportion of 74% $SiO_2$—14%$Li_2O$—4%$Al_2O_3$— 2%$P_2O_5$, — 2%$K_2O$—2%$ZnO$—2%$Na_2O$ (Pb content 50 ppm or below, deforming temperature 480° C.) was mixed with quartz (linear expansion coefficient 15 ppm/° C.), gahnite (linear expansion coefficient 10 ppm/° C.), petalite (linear expansion coefficient 8 ppm/° C.), forsterite (linear expansion coefficient 10 ppm/° C.), cristobalite (linear expansion coefficient 20ppm/° C.), wollastonite (linear expansion coefficient 9 ppm/° C.) and enstatite (linear expansion coefficient 9 ppm/° C.) in composition shown in Table 1. The mixture was milled, and an organic binder was added and sufficiently mixed. Thereafter,a molded body having a shape was prepared by a monoaxial pressing method. From the molded body the binder was removed in $N_2+H_2O$ at a temperature of 700° C., and thereafter, the remaining molded body was sintered at a temperature of 850° to 1300° C. in an atmosphere to produce a sintered body.

The linear thermal expansion coefficients of the resulting sintered bodies were measured at 40° to 400° C., and shown in Table 1. Each sintered body was processed in a diameter of 60 mm and a thickness of 2 mm, and the dielectric constant and the dielectric loss of each sintered body were measured by the technique of JISC-2141. The measurement was performed by using an LCR meter (Y. H. P4284A). The electrostatic capacity at 25° C. was measured under the conditions of 1 MHz and 1.0 V rsm, and from this electrostatic capacity, the dielectric constant at 25 ° C. was measured. Furthermore, the presence or absence of residual carbon after treatment of removal of the binder was confirmed.

(Heat cycle test after mounting the package)

Next, each starting material shown in Table 1 was mixing with toluene and isopropyl alcohol as solvents, an acrylic resin as the binder, and DBP (dibutyl phthalate) as the plasticizer, a green sheet having a thickness of 500 μm by a doctor blade method was prepared.

The metallized layer of wiring was coated with a Cu metallized paste on the surface of the green sheet based on the screen printing method. Further, through-holes were formed on designated positions of the green sheet so that the through-holes were exposed to the lower surface of the substrate. The Cu metallized paste was filled in the insides of the through-holes. Six green sheets coated with the metallized paste were laminated and bonded under pressure while the through-holes were aligned in position.

The binder was removed from the laminated sheet in $N_2+H_2$ at 700° C. and at each of the sintering temperatures shown in Table 1, the metallized layer of wiring and the insulation substrate were sintered at the same time to produce a circuit board for a package with a size of 40(l)×40 (w)×1.8(t) mm.

Next, on the lower surface of the circuit board, a concave portion to be connected to a through-hole was formed. As shown in FIG. 1, ball-like connecting terminals composed to a solder (tin 30 to 10%, lead 70 to 90%) were secured to connecting pads. The ball-like connecting terminals were formed on the lower surface of the circuit board at a density of 30 terminals per $cm^2$.

On the other hand, a printed circuit board obtained by forming a wiring conductor composed of a copper foil on the surface of an insulation body composed of a glass-epoxy substrate was prepared.

The above circuit board for a package was aligned in position so that a wiring conductor on the printed wiring board is connected to a connecting terminal of the circuit board for a package. The above arrangement was heat-treated for 3 minutes at 260° C. in an atmosphere of $N_2$ to mount the package on the surface of the printed circuit board. This heat-treatment melted the connecting terminals composed of the solder on the package circuit board, and it was confirmed that electrical connection was performed to the wiring conductor of the printed wiring board.

The circuit board for package mounted on the surface of the printed wiring board as a test sample was maintained through one cycle consisting of 15 minutes/15 minutes in a constant temperature tank controlled at −40° C. and 125° C. in an atmosphere, and in the highest cycle, the sample was maintained repeatedly through 1000 cycles. In each cycle, the electric resistances of the wiring conductor of the printed wiring board and the circuit board for package were measured, and the number of cycles at which variation appears in electric resistance was counted and the results are shown in Table 1. Furthermore, peeling, melting and poor sintering were evaluated with respect to the Cu metallized layer by simultaneous sintering.

As referential sample, a W (tungsten) metallized paste was coated in a wiring pattern on the surface of an $Al_2O_3$ molded body composed of 98% by weight of $Al_2O_3$ and 2% by weight of $SiO_2$, CaO and MgO, and the coated product was sintered for 1 hour in an atmosphere of 160° C. in $N_2$ +$H_2$ to prepare a circuitboad.

In the same way as above, ball-like connecting terminals composed of a solder were secured, and the circuit board was subjected to a heat cycle test in the same way as above.

TABLE 1

| Sample No. | Composition (vol. %) | | Sintering initiation temp. (°C.) | Sintering temp. (°C.) | Linear expansion coefficient (ppm/°C.) | Dielectric constant | Dielectric loss ×10⁻⁴ | Heat cycle test (times) | Presence or absence of carbon after of the binder | Evaluation Cu metallized layer |
|---|---|---|---|---|---|---|---|---|---|---|
| | Glass | Filler | | | | | | | | |
| 1-*1 | 100 | — | 400 | 850 | 11 | 5.2 | 30 | — | precence | poor sintered |
| 1-*2 | 85 | quarts 15 | 500 | 850 | 12 | 4.9 | 35 | — | precence | poor sintered |

TABLE 1-continued

| Sample No. | Composition (vol. %) Glass | Filler | | Sintering initiation temp. (°C.) | Sintering temp. (°C.) | Linear expansion coefficient (ppm/°C.) | Dielectric constant | Dielectric loss ×10$^{-4}$ | Heat cycle test (times) | Presence or absence of carbon after of the binder | Evaluation Cu metallized layer |
|---|---|---|---|---|---|---|---|---|---|---|---|
| 1-3 | 80 | quarts | 20 | 700 | 950 | 14 | 4.8 | 40 | >1000 | absence | good |
| 1-4 | 60 | quarts | 40 | 730 | 1000 | 16 | 4.6 | 50 | >1000 | absence | good |
| 1-5 | 20 | quarts | 80 | 900 | 1200 | 18 | 4.5 | 30 | >1000 | absence | good |
| 1-*6 | <u>15</u> | quarts | <u>85</u> | 950 | 1300 | 20 | 4.5 | 42 | — | absence | Cu melted |
| 1-7 | 50 | gahnite | 50 | 780 | 1000 | 13 | 6.4 | 40 | >1000 | absence | good |
| 1-8 | 50 | petalite | 50 | 690 | 950 | 9 | 7.0 | 55 | >1000 | absence | good |
| 1-9 | 50 | forsterite | 50 | 750 | 1000 | 11.5 | 6.3 | 31 | >1000 | absence | good |
| 1-10 | 50 | quarts | 50 | 790 | 1000 | 12 | 5.6 | 58 | >1000 | absence | good |
| 1-11 | 50 | forsterite | 50 | 800 | 1000 | 8 | 6.5 | 50 | >1000 | absence | good |
| 1-12 | 34 | forsterite | 66 | 750 | 1000 | 10 | 6.8 | 26 | >1000 | absence | good |
| 1-13 | 30 | forsterite | 70 | 720 | 1000 | 11 | 6.6 | 15 | >1000 | absence | good |
| 1-14 | 35 | forsterite | 65 | 700 | 1000 | 12 | 7.0 | 30 | >1000 | absence | good |
| 1-15 | 50 | cristobalite | 50 | 700 | 1000 | 17 | 4.6 | 52 | >1000 | absence | good |
| 1-16 | 50 | wollastonite | 50 | 750 | 1000 | 12 | 6.0 | 30 | >1000 | absence | good |
| 1-17 | 50 | enstatite | 50 | 750 | 1000 | 10 | 6.3 | 40 | >1000 | absence | good |
| 1-18 | 50 | Magnesia | 50 | 820 | 1000 | 11 | 6.9 | 45 | >1000 | absence | good |
| Reference | | $Al_2O_3$ | | — | 1600 | 7.1 | 9.8 | 24 | <200 | — | — |

*indicates samples outside the ranges of the invention.

As is clear from Table 1, in samples Nos. 1-1 and 1-2 in which the amount of the filler was less than 20% by volume, the sintering initiation temperature was lower, and the removal of the binder was poor. In sample No. 1-6 in which the amount of the filler exceeded 80% by volume, the metallized layer was melted.

The referential sample composed of an alumina insulation substrate developed poor connection in 200 cycles.

On the other hand, the circuit board of this invention containing 20 to 80% by volume of the filler does not develop a poor result after the removal of the binder, and the simultaneous sintering of the Cu metallized layer was good. Further, when the circuit board produced by using a glass ceramic having a linear thermal expansion coefficient of 8 to 18 ppm/°C. as an insulation substrate was subjected to 1000 cycles of temperature elevation and falling, no variation in electric resistance between the wiring conductor of the printed wiring board and the package circuit board was seen at all, and a very stable good electric connecting condition could be maintained.

Example 2

Glass having a deforming temperature, a linear thermal expansion coefficient at 40° to 400° C. and the composition as shown in Table 2. Forsterite, alumina, quartz and cristobalite as fillers were added in proportions shown in Table 2 to the glass. The mixture was milled, and an organic binder was added, and fully mixed. By a monoaxial pressing method, a molded body was produced. This molded body was sintered at 800° to 1200° C. in an atmosphere to form a sintered body. The resulting sintered body was measured by the same methods as in Example 1 to determine the crystal phase in the sintered body, the linear expansion coefficient at 40° to 400° C., dielectric constant, and a heat cycle test after mounting the circuit board on the printed wiring board. Furthermore, the presence or absence of residual carbon after removal of the binder, and the Cu metallized layer of wiring by simultaneous sintering were observed. The results are shown in Table 3.

TABLE 2

| | Glass | | | | Linear |
|---|---|---|---|---|---|
| Sample No. | Composition The numerals before the chemical formulae indicate weight % | Linear expansion coefficient (ppm/°C.) | Deforming temp. (°C.) | Filler | expansion coefficient (Ppm/°C.) |
| 2-*19 | $78SiO_2$—$15B_2O_3$—$5Na_2O$—$2Al_2O_3$ | <u>5</u> | 720 | forsterite | 10 |
| 2-20 | $69SiO_2$—$18B_2O_3$—$8K_2O$—$5Al_2O_3$ | 6 | 700 | forsterite | 10 |
| 2-21 | $45SiO_2$—$28Al_2O_3$—$10B_2O_3$—$10MgO$—$7ZnO$ | 6 | 720 | forsterite | 10 |
| 2-22 | $45SiO_2$—$28Al_2O_3$—$10B_2O_3$—$10MgO$—$7ZnO$ | 6 | 720 | quartz | 15 |
| 2-23 | $45SiO_2$—$28Al_2O_3$—$10B_2O_3$—$10MgO$—$7ZnO$ | 6 | 720 | alumina | 7 |
| 2-24 | $45SiO_2$—$28Al_2O_3$—$10B_2O_3$—$10MgO$—$7ZnO$ | 6 | 720 | cristobalite | 15 |
| 2-25 | $70SiO_2$—$10Li_2O$—$14ZnO$—$32Al_2O_3$—$3P_2O_3$ | <u>20</u> | 750 | forsterite | 10 |

*mark indicates samples outside the ranges of the present invention. Glass: filler = 50:50 by volume and constant.

TABLE 3

| Sample No. | Sintering initiation temp. (°C.) | Sintering temp. (°C.) | Linear expansion coefficient (ppm/°C.) | Dielectric constant | Dielectric loss ×10$^{-4}$ | Heat cycle test (times) | Presence or absence of carbon of the binder | Evaluation of the Cu metallized layer |
|---|---|---|---|---|---|---|---|---|
| 2-*19 | 760 | 1000 | 7 | 5.7 | 27 | 10 | absence | peeling occurred |
| 2-20 | 750 | 1000 | 8 | 5.9 | 10 | >1000 | absence | good |
| 2-21 | 770 | 1000 | 9 | 5.8 | 29 | >1000 | absence | good |
| 2-22 | 770 | 1000 | 13 | 5.5 | 23 | >1000 | absence | good |
| 2-23 | 770 | 1000 | 9 | 6.2 | 30 | >1000 | absence | good |
| 2-24 | 770 | 1000 | 12 | 5.3 | 25 | >1000 | absence | good |
| 2-*27 | 750 | 1000 | 18 | 6.1 | 33 | 50 | absence | good |

*indicates samples outside the ranges of the present invention.

Furthermore, in samples Nos. 2-19 and 2-23 in which the linear expansion coefficient of the glass is outside the range of 8–18 ppm/° C., the occurrence of cracks presumably due to a linear expansion coefficient difference between the filler and the glass was recognized.

On the other hand, the products of the present invention which satisfy specific ranges of deforming temperature and linear expansion coefficient could almost completely remove the binders and make dense sintered bodies. Furthermore, the simultaneous sintering with the Cu metallized layer was possible, and the Cu metallized layer show high adhesion strength with an insulating substrate.

Example 3

As glasses, two types of glass having 74% $SiO_2$—14% $Li_2O$—4% $Al_2O_3$—2%$P_2O_5$—2%$K_2O$—2%$ZnO$—2%$Na_2O$ (Pb content not larger than 50 ppm, deforming temperature 480° C.) and 78% $SiO_2$—10%$Li_2$—4%$Al_2O_3$— 2%$P_2O_5$—5%$K_2O$ (Pb content not larger than 50 ppm, deforming temperature 480° C.) [weight proportions] were prepared. Each of these glasses was mixed with the following fillers in proportions shown in in Table 4.

The fillers include forsterite (linear expansion coefficient 10 ppm/° C.), quartz (linear expansion coefficient 15 ppm/° C.), cristobalite (linear expansion coefficient 20 ppm/° C.), wollastonite (linear expansion coefficient 9 ppm/° C.), petalite (linear expansion coefficient 8 ppm/° C.), nepheline (linear expansion coefficient 9 pp/° C.), mulite (linear expansion coefficient 4 ppm/° C.) and alumina (linear expansion coefficient 7 ppm/° C.). The mixture was molled and sufficiently admixed with an organic binder. Thereafter, by a monoaxial pressing method, a molded body was produced. This molded body was subjected to a treatment of removing the binder in $N_2+H_2$ at 700° C. and then sintered at 850 to 1300° C. in an atmosphere of nitrogen to form a sintered body.

With respect to the resulting sintered body, the crystalline phase of the sintered body, the linear expansion coefficient at 40° to 400° C., the dielectric constant, the dielectric loss and a heat cycle test of the package at the time of mounting were determined by the same methods as in Example 1. Furthermore, the presence or absence of residual carbon after the removal of the binder, and the Cu metallized layer of wiring at the time of simultaneous sintering were observed. The results are shown in Table 4.

TABLE 4

| Sample No. | Composition (vol. %) | | | | Shrinking initiation temp. (°C.) | Sintering temp. (°C.) | Linear expansion coefficient (ppm/°C.) | Dielectric constant | Dielectric loss ×10$^{-4}$ | Heat cycle test (times) | Presence or absence of carbon after of the binder | Evaluation Cu metallized layer |
|---|---|---|---|---|---|---|---|---|---|---|---|---|
| | Crystal | Glass | Filler | | | | | | | | | |
| 3-1 | 1 | 50 | forsterite | 50 | 750 | 850 | 11.5 | 6.3 | 31 | >1000 | absence | good |
| 3-*2 | 1 | 100 | — | | 400 | 650 | 11.0 | 5.2 | 30 | impossible to sinter with Cu simultaneously | | |
| 3-3 | 1 | 34 | forsterite | 66 | 750 | 950 | 10.0 | 6.8 | 26 | >1000 | absence | good |
| 3-4 | 1 | 30 | forsterite petalite | 60 10 | 720 | 950 | 11.0 | 6.6 | 15 | >1000 | absence | good |
| 3-5 | 1 | 35 | forsterite nepheline | 60 5 | 700 | 950 | 12.0 | 7.0 | 30 | >1000 | absence | good |
| 3-*6 | 1 | 50 | forsterite alumina | 40 10 | 820 | 900 | <u>6.1</u> | 6.9 | 45 | — | absence | good |
| 3-*7 | 1 | <u>85</u> | quartz | 15 | 500 | 700 | | impossible to sinter with Cu simultaneously | | | | |
| 3-8 | 1 | 50 | quartz | 50 | 700 | 850 | 18 | 4.6 | 50 | >1000 | absence | good |
| 3-*9 | 1 | <u>15</u> | quartz | 85 | 1200 | 1350 | | impossible to sinter | | | | |
| 3-10 | 1 | 50 | quartz alumina | 42 8 | 790 | 950 | 12 | 5.6 | 58 | >1000 | absence | good |
| 3-11 | 1 | 50 | cristobalite | 50 | 700 | 950 | 17 | 4.6 | 52 | >1000 | absence | good |
| 3-12 | 1 | 50 | wollastonite | 50 | 750 | 950 | 12 | 6.0 | 30 | >1000 | absence | good |
| 3-13 | 1 | 50 | petalite | 50 | 690 | 850 | 9 | 7.0 | 55 | >1000 | absence | good |
| 3-14 | 1 | 50 | magnesia | 50 | 760 | 900 | 10.9 | 5.3 | 34 | >1000 | absence | good |
| 3-*15 | 1 | <u>85</u> | nepheline | 15 | 460 | 700 | | impossible to sinter with Cu simultaneously | | | | |
| 3-*16 | 1 | 50 | mulite | 50 | 720 | 950 | 6.2 | 5.6 | 38 | >1000 | absence | good |
| 3-17 | 2 | 80 | foresterite | 20 | 750 | 850 | 11.1 | 7.3 | 33 | >1000 | absence | good |

TABLE 4-continued

| Sample No. | Composition (vol. %) | | | | Shrinking initiation temp. (°C.) | Sintering temp. (°C.) | Linear expansion coefficient (ppm/°C.) | Dielectric constant | Dielectric loss ×10⁻⁴ | Heat cycle test (times) | Presence or absence of carbon after of the binder | Evaluation Cu metallized layer |
|---|---|---|---|---|---|---|---|---|---|---|---|---|
| | Crystal | Glass | Filler | | | | | | | | | |
| 3-*18 | 2 | 85 | quartz | 15 | 580 | 750 | impossible to sinter with Cu simultaneously | | | | | |
| 3-*19 | 2 | 60 | quartz | 40 | 730 | 900 | 24.0 | 6.2 | 36 | >1000 | absence | good |
| 3-20 | 2 | 60 | quartz alumina | 30 10 | 730 | 900 | 17.8 | 6.8 | 38 | >1000 | absence | good |
| 3-21 | 2 | 80 | cristobalite alumina | 10 10 | 700 | 850 | 18.0 | 6.9 | 35 | >1000 | absence | good |
| 3-22 | 2 | 80 | wollastonite | 20 | 630 | 850 | 11.5 | 7.1 | 40 | >1000 | absence | good |
| 3-23 | 2 | 80 | petalite | 20 | 600 | 850 | 9.2 | 6.8 | 35 | >1000 | absence | good |
| 3-24 | 2 | 80 | magnesia | 80 | 640 | 850 | 11.6 | 7.6 | 38 | >1000 | absence | good |
| 3-25 | 2 | 70 | forsterite nepheline | 20 10 | 690 | 850 | 10.6 | 6.9 | 36 | >1000 | absence | good |

*indicates samples within the ranges of the present invention

As is clear from Table 4, sample No. 3-9 in which the content of glass is less than 20% by volume cannot make a dense sintered body. Samples Nos. 3-2, 3-7, 3-15 and 3-16 in which the content of glass exceeds 80% by volume melted the metallized layer and could not be sintered simultaneously with Cu.

On the other hand, the circuit boards of the present invention in which the amount of the filler is 20 to 80% by volume did not cause poor removal of the binder, and the simultaneous sintering with the Cu metallized layer was good. A circuit board for package prepared by using a glass-ceramic having a linear expansion coefficient of 8 to 18 ppm/° C. as an insulation substrate was subjected to 1000 cycles of elevation and falling of temperature whereby even after these cycles, no variation of electric resistance was seen between the wiring conductor of the printed wiring board and the circuit board for package, and a very stable good electrical connecting condition could be maintained.

When the crystalline phase was identified by an X-ray diffraction measrement, crystalline phases due to lithium silicate and the filler component were detected from the sintered body of the present invention.

Example 4

As is seen from Table 5, glass in which the amount of $Li_2O$ was different was mixed with forsterite as a filler in a weight ratio of 30:70. The mixture was molded in the same way as in Example 3 The binder was removed from the molded body and the resulting molded body was sintered at the temperature shown in Table 5. With the resulting sintered bodies, the linear expansion coefficient at 40° to 400° C., the dielectric constant, the dielectric loss and the presence or absence of residual carbon after removal of the binder were determined by the same methods as in Example 1.

A circuit board containing Cu metallized layer as wiring was produced by using the composition of Table 5 in the same way as Example 3, and mounted on the printed wiring board. After mounting the circuit board on the printed wiring board, a heat cycle test was carried out, and furthermore, the wiring layer of Cu by simultaneous sintering was observed. The results are shown in Table 6.

TABLE 5

Glass: Filler = 30:70 (by weight)

| Sample No. | Crystal Glass | | | | Linear expansion coefficient (Ppm/°C.) |
|---|---|---|---|---|---|
| | Composition The numerals before the chemical formulae indicate weight % | Linear expansion coefficient (ppm/°C.) | Deforming temp. (°C.) | Filler | |
| 4-*26 | $78SiO_2$—$15B_2O_3$—$5Na_2O$—$2Al_2O_3$ | 5 | 720 | forsterite | 10 |
| 4-27 | $72SiO_2$—$5Li_2O$—$23Al_2O_3$ | 10 | 750 | forsterite | 10 |
| 4-28 | $75SiO_2$—$10Li_2O$—$10CaO$—$5MgO$ | 11 | 700 | forsterite | 10 |
| 4-29 | $65SiO_2$—$20Li_2O$—$10Al_2O_3$—$3Na_2O$—$2P_2O_5$ | 11 | 730 | forsterite | 10 |
| 4-30 | $60SiO_2$—$30Li_2O$—$5CaO$—$5Al_2O_3$ | 12 | 730 | forsterite | 10 |
| 4-**31 | $54SiO_2$—$40Li_2O$—$6BaO$ | 12 | 770 | forsterite | 10 |
| 4-*32 | $72SiO_2$—$6Al_2O_3$—$6Li_2O$—$3Na_2O$ $3K_2O$—$5B_2O_3$—$5ZnO$ | 10 | 300 | forsterite | 10 |
| 4-*33 | $74SiO_2$—$11Li_2O$—$8Al_2O_3$—$2P_2O_3$ $3K_2O$—$2B_2O_3$ | 10 | 850 | forsterite | 10 |

*shows samples outside the ranges of the present invention and
**indicate samples for reference.

TABLE 6

| Sample No. | Shrinking initiation temp. (°C.) | Sintering temp. (°C.) | Linear expansion coefficient (ppm/°C.) | Dielectric constant | Dielectric loss ×10⁻⁴ | Heat cycle test (times) | Presence or absence of carbon of the binder | Evaluation of the Cu metallized layer |
|---|---|---|---|---|---|---|---|---|
| 4-*26 | 760 | 1000 | 7 | 5.7 | 27 | 10 | absence | peeling occurred |
| 4-27 | 780 | 1050 | 10 | 7.2 | 25 | 1000 | absence | good |
| 4-28 | 750 | 1000 | 11 | 6.0 | 30 | 1000 | absence | good |
| 4-29 | 760 | 1000 | 11 | 6.2 | 42 | 1000 | absence | good |
| 4-30 | 760 | 1000 | 11 | 7.0 | 45 | 1000 | absence | good |
| 4-**31 | 800 | 1050 | 11.5 | 7.5 | 220 | 1000 | absence | good |
| 4-*32 | 520 | 700 | cannot be fired simulteneously with Cu | | | | | |
| 4-*33 | 900 | 1200 | cannot be fired simulteneously with Cu | | | | | |

*indicates samples outside the ranges of the present invention.
**shows a sample for reference.

As is clear from Tables 5 and 6, sample No. 4-26 in which the glass did not contain $Li_2O$ had a linear expansion coefficient of lower than 6 ppm/° C. developed the occurrence of cracks which may be presumably ascribed to the difference of expansion coefficient from the filler. Sample No. 4-31 in which the content of $Li_2O$ exceeded 30% by weight had a dielectric loss of greater than $100\times10^{-4}$.

On the other hand, samples Nos. 4-27 to 4-30 in which glass had an $Li_2O$ content of 5 to 30% by weight and a deforming temperature of 400° to 800° C. could remove the contained binder almost completely to form dense sintered bodies, and could sinter with Cu metellized layer.

When crystalline phases were identified by an X-ray diffraction measurement, crystalline phases of lithium silicate, forsterite and enstatite were detected from the samples except the sample No. 4-26 containing no $Li_2O$.

Example 5

Two types of glass having a weight proportion of 74%$SiO_2$—14%$Li_2O$—4%$Al_2O_3$—2%$P_2O_5$—2%$K_2O$—2%ZnO—2%$Na_2O$ (Pb content not larger than 50 ppm, deforming temperature 480° C.) and a weight proportion of 78%$SiO_2$—10%$Li_2O$—4%$Al_2O_3$—2%$P_2O_5$—5%$K_2O$—1%$Na_2O$ (Pb content not larger than 50 ppm, deforming temperature 480° C.) were prepared, and mixed with filler components selecting from the group of forsterite (linear exapnsion coefficient 10 ppm/° C.), quartz, (linear expansion coefficient 8 ppm/° C.), nepheline (linear expansion coefficient 9 ppm/° C.), lithium silicate (linear expansion coefficient 13 ppm/° C.) and lithia in accordance with the composition shown in Tables 7 and 8. The mixture was milled, and mixed sufficiently with the organic binder. Thereafter, by a monoaxial pressing method, a molded body was prepared. From the molded body, the binder was removed in $N_2+H_2$ at a temperature of 700° C., and the treated molded body was sintered at 650° to 1300° C. in an atmosphere of nitrogen.

(Evaluation of the characteristics)

With respect to the resulting sintered bodies, the crystalline phases in the sintered body, the linear expansion coefficient at 40° to 400° C., the dielectric constant, the dielectric loss and a heat cycle test of the package after mounting were determined. In addition, the presence or absence of residual carbon after removal of the binder at 700° C. and the wiring layer of the Cu metallized by simultaneous sintering were observed. The results are shown in Tables 7 and 8.

TABLE 7

| Sample No. | Composition (vol. %) | | | | | Shrinking initiation temp. (°C.) | Sintering temp. (°C.) | Linear expansion coefficient (ppm/°C.) | Presence or absence of inflection point | Dielectric constant | Dielectric loss ×10⁻⁴ | Heat cycle test (times) | Presence or absence of carbon after the binder | Cu metallized property | Crystal phase (note 1) |
|---|---|---|---|---|---|---|---|---|---|---|---|---|---|---|---|
| | Glass | | Filler (note 1) | | | | | | | | | | | | |
| | type | amount | forsterite | quartz | other | | | | | | | | | | |
| 5-*1 | i | 15 | 42.5 | 42.5 | — | 1200 | 1350 | Sintering at a low temperature impossible | | | | | | | |
| 5-2 | i | 50 | 25 | 25 | — | 700 | 1000 | 13.6 | absence | 5.6 | 33 | >1000 | absence | good | LS,F,E,Q |
| 5-3 | i | 60 | 20 | 20 | — | 715 | 1000 | 13.6 | absence | 5.5 | 26 | >1000 | absence | good | LS,F,E,Q |
| 5-*4 | i | 85 | 7.5 | 7.5 | — | 500 | 800 | 11.8 | absence | 5.3 | 25 | — | present | impossible to sinter simultaneously with Cu | |
| 5-**5 | i | 50 | 50 | — | — | 700 | 1000 | 11.7 | absence | 6.8 | 24 | >1000 | absence | good | LS,F,E |
| 5-**6 | i | 40 | 60 | — | — | 715 | 1000 | 11.9 | absence | 6.7 | 23 | >1000 | absence | good | LS,F,E |
| 5-*7 | i | 50 | — | 50 | — | 700 | 1000 | 20.0 | present | 6.2 | 13 | >1000 | absence | good | LS,C,Q |
| 5-*8 | i | 40 | — | 60 | — | 715 | 1000 | 24.0 | present | 6.0 | 12 | >1000 | absence | good | LS,C,Q |
| 5-9 | i | 35 | 35 | 30 | — | 740 | 1000 | 14.4 | absence | 5.6 | 26 | >1000 | absence | good | LS,F,E,Q |

TABLE 7-continued

| Sample No. | Composition (vol. %) | | | | | Shrinking initiation temp. (°C.) | Sintering temp. (°C.) | Linear expansion coefficient (ppm/°C.) | Presence or absence of inflection point | Dielectric con stant | Dielectric loss ×10⁻⁴ | Heat cycle test (times) | Presence or absence of carbon after the binder | Cu metallized property | Crystal phase (note 1) |
|---|---|---|---|---|---|---|---|---|---|---|---|---|---|---|---|
| | Glass | | Filler (note 1) | | | | | | | | | | | | |
| | type | amount | forsterite | quartz | other | | | | | | | | | | |
| 5-10 | 1 | 35 | 40 | 25 | — | 740 | 1000 | 13.7 | absence | 5.5 | 25 | >1000 | absence | good | LS,F,E,Q |
| 5-11 | 1 | 35 | 50 | 15 | — | 740 | 1000 | 13.2 | absence | 5.4 | 27 | >1000 | absence | good | LS,F,E,Q |
| 5-12 | 1 | 35 | 30 | 30 | Pt 1 | 740 | 950 | 12.2 | absence | 5.3 | 26 | >1000 | absence | good | LS,F,E,Q |
| 5-13 | 1 | 35 | 30 | 30 | Pt 5 | 740 | 950 | 12.6 | absence | 5.6 | 26 | >1000 | absence | good | LS,F,E,Q,Pt |
| 5-14 | 1 | 35 | 25 | 25 | Pt 15 | 740 | 950 | 9.5 | absence | 5.5 | 28 | >1000 | absence | good | LS,F,E,Q,Pt |
| 5-15 | 1 | 35 | 30 | 30 | Np 1 | 740 | 950 | 11.8 | absence | 5.4 | 18 | >1000 | absence | good | LS,F,E,Q,Np |
| 5-16 | 1 | 35 | 30 | 30 | Np 5 | 740 | 950 | 12.2 | absence | 5.4 | 18 | >1000 | absence | good | LS,F,E,Q,Np |
| 5-17 | 1 | 35 | 30 | 30 | LiO 5 | 720 | 950 | 12.8 | absence | 5.3 | 15 | >1000 | absence | good | LS,F,E,Q |
| 5-16 | 1 | 35 | 30 | 30 | LS 5 | 750 | 950 | 12.6 | absence | 5.3 | 16 | >1000 | absence | good | LS,F,E,Q |
| 5-*19 | 1 | 100 | — | — | — | 400 | 650 | 11.0 | absence | 5.2 | 30 | — | present | impossible to sinter simultaneously with Cu | |

*indicates samples outside the range of the present invention.
**shows samples in Referential Example.
(Note 1) LS: lithium silicate, F: forsterite, E: entatite, Q: quartz, C: cristobalite, Pt: petalite, Np: nepheline, LiO: lithia.

TABLE 8

| Sample No. | Composition (vol. %) | | | | | Shrinking initiation temp. (°C.) | Sintering temp. (°C.) | Linear expansion coefficient (ppm/°C.) | Presence or absence of inflection point | Dielectric con stant | Dielectric loss ×10⁻⁴ | Heat cycle test (times) | Presence or absence of carbon after the binder | Cu metallized property | Crystal phase (note 1) |
|---|---|---|---|---|---|---|---|---|---|---|---|---|---|---|---|
| | Glass | | Filler (note 1) | | | | | | | | | | | | |
| | type | amount | forsterite | quartz | other | | | | | | | | | | |
| 5-*20 | 2 | 15 | 42.5 | 42.5 | — | 1220 | 1350 | | Sintering at low temperature impossible | | | | | | |
| 5-21 | 2 | 50 | 25 | 25 | — | 13.5 720 | 1000 | | absence | 5.7 | 35 | >1000 | absence | good | LS,F,E,Q |
| 5-22 | 2 | 60 | 20 | 20 | — | 13.2 730 | 1000 | | absence | 5.6 | 29 | >1000 | absence | good | LS,F,E,Q |
| 5-*23 | 2 | 85 | 7.5 | 7.5 | — | 11.5 520 | 600 | | absence | 5.3 | 26 | — | present | impossible to sinter simultaneously with Cu | |
| 5-**24 | 2 | 50 | 50 | — | — | 11.3 720 | 1000 | | absence | 6.9 | 24 | >1000 | absence | good | LS,F,E |
| 5-**25 | 2 | 40 | 60 | — | — | 11.7 735 | 1000 | | absence | 6.7 | 23 | >1000 | absence | good | LS,F,E |
| 5-*26 | 2 | 50 | — | 50 | — | 20.0 740 | 1000 | | present | 6.3 | 15 | >1000 | absence | good | LS,C,Q |
| 5-*27 | 2 | 40 | — | 60 | — | 23.5 745 | 1000 | | present | 6.2 | 13 | >1000 | absence | good | LS,C,Q |
| 5-28 | 2 | 35 | 35 | 30 | — | 14.2 770 | 1000 | | absence | 5.7 | 27 | >1000 | absence | good | LS,F,E,Q |
| 5-29 | 2 | 35 | 40 | 25 | — | 13.5 770 | 1000 | | absence | 5.5 | 24 | >1000 | absence | good | LS,F,E,Q |
| 5-30 | 2 | 35 | 50 | 15 | — | 12.9 770 | 1000 | | absence | 5.5 | 27 | >1000 | absence | good | LS,F,E,Q |
| 5-31 | 2 | 35 | 30 | 30 | Pt 1 | 12.5 770 | 950 | | absence | 5.7 | 25 | >1000 | absence | good | LS,F,E,Q,Pt |
| 5-32 | 2 | 35 | 25 | 25 | Pt 15 | 9.3 770 | 950 | | absence | 5.6 | 28 | >1000 | absence | good | LS,F,E,Q,Pt |
| 5-33 | 2 | 35 | 30 | 30 | Np 5 | 12.0 770 | 950 | | absence | 5.5 | 18 | >1000 | absence | good | LS,F,E,Q,Np |
| 5-34 | 2 | 35 | 30 | 30 | LiO 5 | 12.6 740 | 950 | | absence | 5.4 | 17 | >1000 | absence | good | LS,F,E,Q |

TABLE 8-continued

| Sample No. | Composition (vol. %) | | | | Shrinking initiation temp. (°C.) | Sintering temp. (°C.) | Linear expansion coefficient (ppm/°C.) | Presence or absence of inflection point | Dielectric constant | Dielectric loss ×10⁻⁴ | Heat cycle test (times) | Presence or absence of carbon after the binder | Cu metallized property | Crystal phase (note 1) |
|---|---|---|---|---|---|---|---|---|---|---|---|---|---|---|
| | Glass | | Filler (note 1) | | | | | | | | | | | |
| | type | amount | forsterite | quartz | other | | | | | | | | | |
| 5-35 | 2 | 35 | 30 | 30 | LS 5 | 770 | 950 | 12.4 | absence | 5.4 | 16 | >1000 | absence | good | LS,F, E,Q |
| 5-*36 | 2 | 100 | — | — | — | 460 | 720 | 10.7 | absence | 5.3 | 33 | — | present | impossible to sinter simultaneously with Cu | |

*indicates samples outside the range of the present invention.
**shows samples in Referential Example.
(Note 1) LS: lithium silicate, F: forsterite, E: entatite, Q: quartz, C: cristobalite, Pt: petalite, Np: nepheline, LiO: lithia.

As is clearly seen from Tables 7 and 8, in samples Nos. 5-1 and 5-20 in which the content of glass was smaller than 20% by volume dense sintered bodies could not be obtained. On the other hand, in samples Nos. 5-4, 5-19, 5-23, and 5-36 in which the content of glass exceeded 80% by volume, could not be sintered simultaneously with Cu.

On the other hand, the circuit board of this invention in which the amount of the filler was 20 to 80% by volume had a dielectric constant of 6 or below, and no poor removal of the binder was developed. In addition, simultaneous sintering with the Cu metallized layer was good. A citcuit board for package prepared from a glass-ceramic having a linear expansion coefficient of 8 to 18 ppm/° C. as an insulation substrate was subjected to 1000 cycles of temperature elevation and falling but no variation of electric resistance was seen between the wiring conductor of the printed wiring board and the circuit board and a very stable good electric connecting conditions could be maintained.

When the crystalline phases were identified by an X-ray diffraction measurement, crystalline phases due to lithium silicate, forsterite, enstatite, quartz and other filler components were detected from the sintered bodies of the present invention.

In samples Nos. 5-7, 5-8, 5-26 and 5-27 in which the filler in the starting materials consists only of quartz, quartz and cristobalite are precipitated in the sintered bodies. This fact shows that an inflection point exists in the thermal expansion coefficient. Furthermore, samples Nos. 5-5, 5-6, 5-24 and 5-25 to which quartz is not added at all have a thermal expansion coefficient of 11 ppm/° C., but possessed a dielectric constant of over 6.

Samples Nos. 5-12 to 5-18 and 5-1 to 5-35 in which petalite, nepheline, lithium silicate and lithia were added as the filler component in addition to forsterite and quartz could be sintered at a lower temperature of 1000° C. than the other products of the present invention to which these fillers were not added.

Example 6

As a glass, glass having a different amount of $Li_2O$ was mixed with forsterite and quartz (in a volume ratio of 1:1) as fillers in a weight ratio (glass : filler) of 30:70. The resulting mixture was molded in the same way as in Example 5. The binder was removed and the resulting molded body was sintered at each of the temperatures shown in Table 10. With respect to the resulting sintered bodies, the linear expansion coefficient at 40° to 400° C., the dielectric constant, the dielectric loss, and the presence or absence of residual carbon after removal of the binder were confirmed.

A circuit board was prepared by using Cu as the metallized layer of wiring in the same way as in Example 5 with the use of the composition shown in Table 9, and mounted on a glass-epoxy substrate. A heat cycle test was performed after mounting, and furthermore, the wiring layer of the Cu metallization sintered simultaneously was observed. The results are shown in Table 10.

TABLE 9

| | Crystal glass | | |
|---|---|---|---|
| Sample No. | Composition The numerals before the chemical formulae indicate weight % | Linear expansion coefficient (ppm/°C.) | Deforming temp. (°C.) |
| 6-*37 | $78SiO_2$—$15B_2O_3$—$5Na_2O$—$2Al_2O_3$ | 5 | 720 |
| 6-38 | $72SiO_2$—$5Li_2O$—$23Al_2O_3$ | 10 | 750 |
| 6-39 | $75SiO_2$—$10Li_2O$—$10CaO$—$5MgO$ | 11 | 700 |
| 6-40 | $65SiO_2$—$20Li_2O$—$10Al_2O_{3-3Na2}O$—$2P_2O_5$ | 11 | 730 |
| 6-41 | $60SiO_2$—$30Li_2O$—$5CaO$—$5Al_2O_3$ | 12 | 730 |
| 6-**42 | $54SiO_2$—$40Li_2O$—$6BaO$ | 12 | 770 |
| 6-*43 | $72SiO_2$—$6Li_2O$—$6Al_2O_{3-3Na2}O$—$3K_2O$—$5B_2O_3$—$5ZnO$ | 10 | 300 |
| 6-*44 | $74SiO_2$—$11Li_2O$—$8Al_2O_{3-2P2}O_3$—$3K_2O$—$2B_2O_3$ | 10 | 850 |

TABLE 9-continued

| | Crystal glass | | |
|---|---|---|---|
| Sample No. | Composition The numerals before the chemical formulae indicate weight % | Linear expansion coefficient (ppm/°C.) | Deforming temp. (°C.) |

*indicate samples outside the ranges of the present invention
**indicate a sample of Reference Example.

TABLE 10

| Sample No. | Shrinking initiation temp. (°C.) | Sintering temp. (°C.) | Linear expansion coefficient (ppm/°C.) | Dielectric constant | Dielectric loss ×10$^{-4}$ | Heat cycle test (times) | Presence or absence of carbon of the binder | Evaluation of the Cu metallized layer |
|---|---|---|---|---|---|---|---|---|
| 6-*37 | 760 | 1000 | 7.5 | 5.5 | 27 | 10 | absence | peeling occurred |
| 6-38 | 780 | 1050 | 10.7 | 6.0 | 26 | >1000 | absence | good |
| 6-39 | 750 | 1000 | 11.7 | 5.8 | 30 | >1000 | absence | good |
| 6-40 | 760 | 1000 | 11.6 | 6.0 | 43 | >1000 | absence | good |
| 6-41 | 760 | 1000 | 11.7 | 6.0 | 46 | >1000 | absence | good |
| 6-**42 | 800 | 1050 | 12.3 | 7.2 | 250 | >1000 | absence | good |
| 6-*43 | 520 | 700 | cannot be fired simalteneously with Cu | | | | | |
| 6-*44 | 900 | 1200 | cannot be fired simalteneously with Cu | | | | | |

*indicates samples outside the ranges of the present invention.
**shows a sample for reference.

As is clear from Tables 9 and 10, sample No. 6-37 containing no $Li_2O$ in the glass had a linear expansion coefficient of lower than 6 ppm/° C., and the occurrence of cracks presumably due to the different of the thermal expansion coefficient between the glass and the filler was recognized. In sample 6-42 in which the content of $Li_2O$ exceeded 30% by weight in the glass, the dielectric loss was greater than 100×10$^{-4}$.

On the other hand, when samples Nos. 6-38 to 6-41 which contained glass having an $Li_2O$ content of 5 to 30% by weight and a deforming temperature of 400° to 800° C., the binders could be almost completely removed to produce dense sintered bodies. Furthermore, the simultaneous sintering with the Cu metallized layer was good in that the deforming temperature was in the range of 400° to 800° C.

When crystalline phases were identified by an X-ray diffraction measurement, crystalline phases of lithium silicate, forsterite, quartz and enstatite were detected from any samples except the sample No. 6-37 containing no $Li_2O$.

Example 7
(Production of sintered bodies)

As a starting powder, a glass composed of a forsterite powder having a purity of at least 99%, an enstatite powder having a purity of at least 99% and any of the following fillers was prepared. The following composition ratios are in weight proportions.

(1) 74%$SiO_2$—14%$Li_2O$—4%$Al_2O_3$—2%$P_2O_5$—2%$K_2O$—2%$ZnO$—2%$Na_2O$ (softening point of 600° C.)

(2) 78%$SiO_2O$—10%$Li_2O$—4%$Al_2O_3$—3%$K_2O$—3%$P_2O$—1%$Na_2O$—1%$B_2O_3$ (softening point 800° C.)

(3) 50%$SiO_2$—9%$Li_2O$—13%$Al_2O_3$— 2%$P_2O_5$—2%$K_2O$—24%$ZnO$ (softening point 1000° C.)
(softening point 1000° C.)

These materials were mixtured in the compositions shown in Tables 11 and 12. The mixture was milled, and thereafter, an organic binder was added. The resulting mixture was fully mixed. Thereafter, by a monoaxial pressing method, a molded body was prepared from the final mixture. From the resulting molded body, the binder was removed in $N_2+H_2$ at 700° C., and the resulting product was sintered at 850° to 1000° C. in an atmosphere to prepare sintered bodies.
(Evaluation of characteristics)

With respect to the resulting sintered bodies, crystalline phases in the sintered bodies, linear expansion coefficients at 40° to 400° C., dielectric constant, dielectric losses, and a heat cycle test after mounting were determined by the same methods as shown in Example 1. Furthermore, the presence or absence of residual carbon after removal of the binders at 700° C. and the wiring layers of Cu metallized by simultaneous sintering were observed The results are shown in Tables 11 and 12.

TABLE 11

| Sample No. | Composition (wt. %) Glass Type | Composition (wt. %) Glass Amount | Filler Forsterite | Filler Enstatite | Sintering Conditions temp. (°C.) | Sintering Conditions time (hr) | Shrinking initiation | Composition of the sintered body (wt. %) Glass | Composition of the sintered body (wt. %) Forsterite | Composition of the sintered body (wt. %) Enstatite | Composition of the sintered body (wt. %) Others | Linear expansion coefficient (ppm/°C.) | Dielectric constant | Dielectric loss |
|---|---|---|---|---|---|---|---|---|---|---|---|---|---|---|
| 7-1 | 1 | 50 | 30 | 20 | 920 | 0.5 | 755 | 25 | 20 | 35 | LS 20 | 9.8 | 6.6 | 25 |
| 7-2 | 1 | 50 | 40 | 10 | 920 | 0.5 | 760 | 20 | 22 | 36 | LS 22 | 10.0 | 6.5 | 30 |
| 7-3 | 1 | 40 | 50 | 10 | 920 | 0.5 | 770 | 13 | 40 | 35 | LS 12 | 9.5 | 6.4 | 35 |
| 7-4 | 1 | 30 | 60 | 10 | 920 | 0.5 | 775 | 10 | 45 | 32 | LS 13 | 9.6 | 6.5 | 21 |
| 7-5 | 2 | 50 | 30 | 20 | 1000 | 0.5 | 781 | 27 | 19 | 35 | LS 19 | 13.1 | 6.6 | 29 |
| 7-6 | 2 | 50 | 40 | 10 | 1000 | 0.5 | 785 | 22 | 21 | 37 | LS 20 | 13.5 | 6.7 | 28 |
| 7-7 | 2 | 30 | 50 | 20 | 1000 | 0.5 | 794 | 14 | 41 | 34 | LS 11 | 11.5 | 6.4 | 29 |
| 7-8 | 2 | 30 | 60 | 10 | 1000 | 0.5 | 800 | 11 | 46 | 31 | LS 12 | 11.8 | 6.3 | 31 |
| 7-9 | 1 | 42 | 58 | — | 1000 | 0.5 | 799 | 24 | 40 | 18 | LS 18 | 11.5 | 6.3 | 31 |
| 7-*10 | 1 | 100 | — | — | 800 | 1 | 400 | 57 | — |  | LS 43 | 11.0 | 5.2 | 30 |
| 7-11 | 1 | 37 | 63 | — | 920 | 0.5 | 800 | 21 | 50 | 13 | LS 16 | 11.2 | 6.5 | 28 |
| 7-12 | 1 | 32 | 68 | — | 920 | 0.5 | 805 | 18 | 52 | 16 | LS 14 | 11.1 | 6.7 | 22 |
| 7-13 | 1 | 31 | 69 | — | 920 | 0.5 | 776 | 18 | 52 | 17 | LS 13 | 10.7 | 6.8 | 24 |
| 7-14 | 1 | 29 | 71 | — | 920 | 0.5 | 772 | 17 | 60 | 11 | LS 12 | 10.8 | 6.7 | 22 |
| 7-15 | 1 | 27 | 73 | — | 950 | 0.5 | 767 | 15 | 55 | 18 | LS 12 | 10.3 | 6.8 | 26 |

*indicates samples within the ranges of the present invention

TABLE 12

| Sample No. | Composition (wt. %) Glass Type | Composition (wt. %) Glass Amount | Filler Forsterite | Filler Enstatite | Sintering Conditions temp. (°C.) | Sintering Conditions time (hr) | Shrinking initiation | Composition of the sintered body (wt. %) Glass | Composition of the sintered body (wt. %) Forsterite | Composition of the sintered body (wt. %) Enstatite | Composition of the sintered body (wt. %) Others | Linear expansion coefficient (ppm/°C.) | Dielectric constant | Dielectric loss |
|---|---|---|---|---|---|---|---|---|---|---|---|---|---|---|
| 7-16 | 1 | 20 | 80 | — | 1000 | 1 | 770 | 11 | 65 | 15 | LS 9 | 10.0 | 6.9 | 22 |
| 7-17 | 1 | 15 | 85 | — | 1000 | 1 | 775 | 9 | 70 | 15 | LS 6 | 9.6 | 7.1 | 20 |
| 7-18 | 2 | 74 | 26 | — | 1000 | 1 | 768 | 42 | 20 | 6 | LS 32 | 15.6 | 7.3 | 33 |
| 7-19 | 2 | 77 | 23 | — | 1000 | 1 | 771 | 44 | 18 | 5 | LS 33 | 16.9 | 7.2 | 35 |
| 7-20 | 2 | 80 | 20 | — | 1000 | 1 | 775 | 46 | 16 | 4 | LS 34 | 18.0 | 7.1 | 37 |
| 7-*21 | 3 | 50 | 50 | — | 950 | 0.5 | 770 | 30 | 50 | 0 | LS 20 | 13.0 | 6.6 | 50 |
| 7-*22 | 3 | 85 | 15 | — | 1000 | 0.5 | 800 | 45 | 10 | 5 | LS 40 | poor sintering | | |
| 7-*23 | 1 | 18 | 82 | — | 1000 | 1 | 800 | 5 | 80 | 10 | LS 5 | poor sintering | | |

*indicates samples within the ranges of the present invention

As is clear from Tables 11 and 12, since sample No. 7-10 containing only the glass was densified at 800° C., the simultaneous sintering with the metalized layer of Cu could not be performed. In sample No. 7-21 containing glass (3) having a small amount of Si-$O_2$, enstatite was not formed by reaction with forsterite, and the resulting sintered body contained a large amount of voids. As shown in sample No. 7-22, the amount of glass was increased to form enstatite. However, since that amount of enstatite was slight and the glass itself had a high sotening point, poor sintering proceeded. Furthermore, since the total amount of forsterite and enstatite exceeded 85% by weight, the amount of the filler must be included in a large amount as in sample No. 7-23, and this caused poor sintering even at a temperature of 1100° C.

On the other hand, because the other samples within the ranges of the present invention had a linear expansion coefficient of 8 to 18 ppm/° C. and became density at a temperature of 800° to 1000° C., simultaneous sintering with the wiring layer such as Cu was possible. In addition, these samples of the present invention showed good dielectric constants and dielectric losses.

A circuit board in accordance with the present invention was mounted on the surface of a printed wiring board, and the resulting test sample was subjected to one cycle composed of 15 minute/15 minute held in a constant temperature tank adjusted to −40° C. and 125° C. in an atmosphere through 1000 cycles repeatedly. As a result, even after passage of 1000 cycles, a variation in electric resistance was not at all seen between the circuit board and the printed wiring board, and a very stable good electrical connected condition could be maintained. Incidentally, when a commercially available glass-ceramic circuit board having a linear expansion coefficient of 6 ppm/° C. was subjected to the same test as above, an electric resistance became greater in about 200 cycles.

Example 8

Two types of glass shown below were prepared.

(1) 74%$SiO_2$—14%$Li_2O$—4%$Al_2O_3$—2%$P_2O_5$—2%$K_2O$—2%ZnO—2%$Na_2O$ (deforming temperature 480° C.)

(2) 43%$SiO_2$—29%$Al_2O_3$—11%MgO—10%$B_2O_3$—7%ZnO (deforming temperature 880° C.)

The numerals represent weight ratios. These glasses were mixed with forsterite and $Cr_2O_3$ as a compound containing Cr so that the prescribed compositions were as shown in Table 13. The mixture was milled, and an organic binder was added and sufficiently mixed with the milled powder. Thereafter, by, a monoaxial pressing method, a molded body having a predetermined shape was prepared. From the molded body, the binder was removed in $N_2+H_2$ at 700° C., and the resulting molded body was sintered at 650° to 1200° C. in an atmosphere of nitrogen to form a sintered body.

With respect to the resulting sintered bodies, strengths, dielectric losses at a measuring frequency of 1 MHz, and simultaneous sinterability with Cu were confirmed. The results are shown in Table 13.

Furthermore, samples Nos. 8-7 and 8-22 in which the amount of $Cr_2O_3$ was smaller than 0.05 part by weight possessed a poor effect of lowering the dielectric loss. Since samples Nos. 8-15 and 8-30 in which the amount of $Cr_2O_3$ exceeded 10 parts by weight had a raised sintering temperature, they were deteriorated in strength and dielectric loss, and the dielectric loss exceeded $1\times10^{-3}$.

In contrast to these Comparative Examples, samples Nos. 8-2 to 8-4, 8-8 to 8-14, 8-17 to 8-19 and 8-23 to 8-29 within the ranges of the present invention showed a strength of at least 230 MPa, a dielectric loss of not larger than $1\times10^{-3}$, and could be sintered simultaneously with Cu. All of these sintered bodies assumed a greenish color and showed a higher packaging recognition than the absence of a chromiun compound. As a result of an X-ray diffraction measurement, the samples of the present invention confirmed the detection of a crystalline phase of lithium silicate and crystalline phase of forsterite and enstatite, quartz.

Example 9

Additives shown in Table 14 were added to the composition of sample No. 8-3 which showed the best character-

TABLE 13

| Sample No. | Composition of main components (vol. %) Glass Type | Composition of main components (vol. %) Glass Amount | Composition of main components (vol. %) Forsterite | $Cr_2O_3$ (note 1) (parts by weight) | Sintering temp. (°C.) | Strength (Mpa) | Dielectric loss ×10⁻⁴ | Simultaneous sinterability with Cu | Color |
|---|---|---|---|---|---|---|---|---|---|
| 8-*1 | 1 | 15 | 85 | 2 | 1350 | — | — | none | green |
| 8-2 | 1 | 35 | 65 | 2 | 900 | 230 | 6 | good | green |
| 8-3 | 1 | 45 | 55 | 2 | 850 | 280 | 6 | good | green |
| 8-4 | 1 | 60 | 40 | 2 | 800 | 250 | 6 | good | green |
| 8-*5 | 1 | 85 | 15 | 2 | 700 | — | — | none | green |
| 8-*6 | 1 | 100 | 0 | 2 | 650 | — | — | none | green |
| 8-7 | 1 | 45 | 55 | 0.04 | 850 | 280 | 13 | good | light green |
| 8-8 | 1 | 45 | 55 | 0.05 | 850 | 280 | 10 | good | light green |
| 8-9 | 1 | 45 | 55 | 0.2 | 850 | 280 | 8 | good | green |
| 8-10 | 1 | 45 | 55 | 2 | 850 | 280 | 6 | good | green |
| 8-11 | 1 | 45 | 55 | 4 | 875 | 270 | 5 | good | green |
| 8-12 | 1 | 45 | 55 | 6 | 900 | 250 | 5 | good | green |
| 8-13 | 1 | 45 | 55 | 8 | 950 | 240 | 6 | good | deep green |
| 8-14 | 1 | 45 | 55 | 10 | 1000 | 230 | 8 | good | deep green |
| 8-15 | 1 | 45 | 55 | 12 | 1050 | 190 | 11 | good | deep green |
| 8-*16 | 2 | 15 | 85 | 2 | 1350 | — | — | none | green |
| 8-17 | 2 | 35 | 65 | 2 | 900 | 230 | 6 | good | green |
| 8-18 | 2 | 45 | 55 | 2 | 850 | 280 | 6 | good | green |
| 8-19 | 2 | 60 | 40 | 2 | 800 | 250 | 6 | good | green |
| 8-*20 | 2 | 85 | 15 | 2 | 700 | — | — | none | green |
| 8-*21 | 2 | 100 | 0 | 2 | 650 | — | — | none | green |
| 8-22 | 2 | 45 | 55 | 0.04 | 850 | 280 | 14 | good | light green |
| 8-23 | 2 | 45 | 55 | 0.05 | 850 | 280 | 10 | good | light green |
| 8-24 | 2 | 45 | 55 | 0.2 | 850 | 280 | 9 | good | green |
| 8-25 | 2 | 45 | 55 | 2 | 850 | 280 | 6 | good | green |
| 8-26 | 2 | 45 | 55 | 4 | 875 | 270 | 5 | good | green |
| 8-27 | 2 | 45 | 55 | 6 | 900 | 250 | 5 | good | green |
| 8-28 | 2 | 45 | 55 | 8 | 950 | 240 | 6 | good | deep green |
| 8-29 | 2 | 45 | 55 | 10 | 1000 | 230 | 8 | good | deep green |
| 8-30 | 2 | 45 | 55 | 12 | 1050 | 190 | 12 | good | deep green |

*indicates samples outside the ranges of the present invention.
(Note 1) The amount of $Cr_2O_3$ is per 100 parts by weight of the composition of main components.

As is clear from Table 13, in samples Nos. 8-1 and 8-16 in which the amount of glass was smaller than 20% by volume, simultaneous sintering with Cu could not be carried out. Furthermore, with respect to samples Nos. 8-5, 8-6, 8-20 and 8-21, the sintering temperature was too low so that simultaneous sintering with Cu could not be carried out.

istics in Table 13, and the mixtures were evaluated in the same way as in Example 8.

TABLE 14

| Sample No. | Composition of coloring agent (Parts by weight) (note 1) | | | Sintering temp. (°C.) | Strength (Mpa) | Dielectric loss ×10⁻⁴ | Simultaneous sinterability with Cu | Color |
|---|---|---|---|---|---|---|---|---|
| | $Cr_2O_3$ | Other | | | | | | |
| 9-31 | — | CuO | 2 | 850 | 270 | 16 | good | reddish green |
| 9-32 | 2 | CuO | 2 | 850 | 280 | 6 | good | reddish green |
| 9-33 | 2 | CuO | 4 | 900 | 260 | 8 | good | reddish green |
| 9-34 | 2 | CuO | 10 | 900 | 190 | 25 | good | deep reddish green |
| 9-35 | 2 | $V_2O_5$ | 2 | 850 | 280 | 6 | good | yellowish green |
| 9-36 | 2 | $V_2O_5$ | 5 | 950 | 260 | 8 | good | yellowish green |
| 9-37 | 2 | $V_2O_5$ | 10 | 1050 | 185 | 22 | good | deep yellowish green |
| 9-38 | 2 | $Fe_2O_3$ | 2 | 850 | 280 | 6 | good | reddish green |
| 9-39 | 2 | $Fe_2O_3$ | 7 | 950 | 250 | 7 | good | reddish-green |
| 9-40 | 2 | $Fe_2O_3$ | 10 | 1050 | 195 | 30 | good | deep reddish green |
| 9-41 | — | NiO | 2 | 850 | 260 | 18 | good | bluish green |
| 9-42 | 2 | NiO | 2 | 850 | 280 | 6 | good | bluish green |
| 9-43 | 2 | NiO | 8 | 900 | 250 | 8 | good | bluish green |
| 9-44 | 2 | NiO | 10 | 900 | 180 | 24 | good | deep bluish green |
| 9-45 | 2 | $MnO_2$ | 2 | 850 | 280 | 6 | good | grayish green |
| 9-46 | 2 | $MnO_2$ | 5 | 900 | 260 | 8 | good | grayish green |
| 9-47 | 2 | $MnO_2$ | 10 | 1050 | 190 | 40 | good | deep grayish green |
| 9-48 | 2 | CoO | 2 | 850 | 280 | 6 | good | bluish green |
| 9-49 | 2 | CoO | 4 | 900 | 260 | 8 | good | bluish green |
| 9-50 | 2 | CoO | 10 | 1050 | 195 | 26 | good | deep bluish green |
| 9-51 | — | $WO_3$ | 2 | 850 | 270 | 17 | good | yellow |
| 9-52 | — | $MoO_3$ | 2 | 850 | 270 | 18 | good | gray |

According to Table 14, when the total amount of $Cr_2O_3$ and other additives was 10 parts by weight or less, the products all showed a strength of at least 230 MPa and a dielectric loss of not larger than $1\times10^{-3}$, and could be colored in various colors.

Samples Nos. 9-34, 9-37, 9-40, 9-44, 9-47 and 9-50 were colored but were deteriorated in strength and dielectric loss. Furthermore, samples Nos. 9-31 and 9-41 which did not contain Cr had a high dielectric loss. For comparison, samples Nos. 9-51 and 9-52 to which $WO_3$ and $MoO_3$ were added as coloring agents could be colored, but could not achieve a dielectric loss of not larger than $1\times10^{-3}$.

Example 10

As shown in Table 15, forsterite having the best characteristics in Table 13 was added to glasses having different compositions at a glass: filler ratio of 45:55 by volume. As a coloring agent, $Cr_2O_3$ was added in an amount of 2 parts by weight per 100 parts by weight of the main component composition. The mixture was prepared and evaluated in the same way as in Example 8. The effects of the amount of $Li_2O$ in the glass and the deforming temperature of the glass upon the characteristics were examined.

TABLE 15

| Sample No. | Glass Composition The numerals before the chemical formulae indicate weight % | Deforming temp. (°C.) | Sintering temp. (°C.) | Strength (MPa) | Dielectric Loss ×10⁻⁴ | Dielectric constant | Simultaneous sinterability with Cu |
|---|---|---|---|---|---|---|---|
| 10-**53 | 78SiO₂—15B₂O₃—5Na₂O—2Al₂O₃ | 720 | 950 | 210 | 27 | 5.5 | good |
| 10-54 | 72SiO₂—5Li₂O—23Al₂O₃ | 750 | 1000 | 270 | 7 | 5.7 | good |
| 10-55 | 75SiO₂—10Li₂O—10CaO—5MgO | 700 | 950 | 280 | 6 | 5.3 | good |
| 10-56 | 65SiO₂—20Li₂O—10Al₂O₃₋₃Na₂O—2P₂O₅ | 730 | 950 | 280 | 6 | 5.9 | good |
| 10-57 | 60SiO₂—30Li₂O—5CaO—5Al₂O₃ | 730 | 950 | 270 | 7 | 5.9 | good |
| 10-**58 | 56SiO₂—40Li₂O—4BaO | 775 | 1000 | 230 | 250 | 6.2 | good |

**indicate samples for reference.

As is clear from the results given in Table 15, sample No. 10-53 which did not contain $Li_2O$ had a dielectric loss exceeding $1\times10^{-3}$. Sample 10-58 which contained more than 30% by weight of $Li_2O$ had a deforming temperature of more than 770° C., and had a greater dielectric loss of $250\times10^{-4}$.

As shown in samples Nos. 10-44 to 10-47, glass containing 5 to 30% by weight of $Li_2O$ had a deforming temperature of 400° to 770° C. The characteristics were good, and the binder could be removed almost completely. Thus, dense sintered bodies could be produced. Furthermore, simultaneous sintering with the Cu metallized layer was possible, and the Cu metallized layer showed a high adhesion strength with the sintered body. Thus, in order to make it possible to perform simultaneous sintering with Cu, the deforming temperature is desirably 400° to 770° C. The samples of the present invention all assumed a greenish color.

What is claimed is:

1. A circuit board, comprising a metallized wiring layer, and an insulation substrate, the insulation substrate comprising a sintered body which has a linear expansion coefficient of 8 to 18 ppm/° C. at a temperature of 40° to 400° C., wherein the sintered body comprises 50 to 99% by weight of a crystalline phase and 1 to 50% by weight of a glass phase, and the crystalline phase comprises enstatite or enstatite and forsterite in an amount of 20 to 85% by weight.

2. The circuit board of claim 1, wherein the crystalline phase comprises lithium silicate.

3. The circuit board of claim 1, wherein the sintered body is obtained by sintering a mold body, the mold body comprising:

20 to 80% by volume of a glass having a linear expansion coefficient of 6 to 18 ppm/° C. at a temperature of 40° to 400° C., and 20 to 80% by volume of a filler having a linear expansion coefficient of at least 6 ppm/° C. at a temperature of 40° to 400° C.

4. The circuit board of claim 3, wherein the filler comprises enstatite and forsterite.

5. The circuit board of claim 3, wherein the filler comprises forsterite and quartz.

6. The circuit board of claim 3, wherein the glass comprises lithium silicate glass containing $Li_8O$ in an amount of 5 to 30% by weight.

7. The circuit board of claim 4, wherein the filler comprises at least one member selected from the group consisting of petalite, nepheline, lithium silicate and lithia.

8. The circuit board of claim 5, wherein the filler comprises at least one member selected from the group consisting of petalite, nepheline, lithium silicate and lithia.

9. The circuit board of claim 1, wherein the sintered body comprises chromium compound.

10. The circuit board of claim 1, wherein the circuit board ha an area of larger than 10 mm×10 mm as a square.

11. The circuit board of claim 1, wherein the circuit board is configured as a package for a semiconductor element or an electrical element.

12. A mounted structure of a circuit board comprising the circuit board is mounted on a surface of a printed wiring board which comprises an insulation layer containing at least an organic resin and a conductor circuit formed on a surface of the insulation layer, wherein the circuit board comprises:

a metallized wiring layer, and an insulation substrate, the insulation substrate of a sintered body having a linear expansion coefficient of 8 to 18 ppm/° C. at a temperature of 40° to 400° C., wherein the sintered body comprises 50 to 99% by weight of a crystalline phase and 1 to 50% by weight of a glass phase, and the crystalline phase comprises enstatite or enstatite and forsterite in an amount of 20 to 85% by weight.

13. The mounted structure of claim 12, wherein a ball-shaped connection terminal is formed on a bottom of the circuit board and the circuit board is mounted on the surface of the printed wiring board via the bell-shaped connection terminal.

* * * * *